US012666624B2

(12) United States Patent
Chang et al.

(10) Patent No.: US 12,666,624 B2
(45) Date of Patent: Jun. 23, 2026

(54) METHOD OF FORMING A MEMORY CELL HAVING AN OFFSET INTERCONNECT VIA EXTENDING THROUGH A HARD MASK WITH VARIABLE THICKNESS

(71) Applicant: Taiwan Semiconductor Manufacturing Company, Ltd., Hsinchu (TW)

(72) Inventors: Fu-Chen Chang, New Taipei City (TW); Tzu-Yu Chen, Kaohsiung City (TW); Sheng-Hung Shih, Hsinchu City (TW); Kuo-Chi Tu, Hsin-Chu (TW); Wen-Ting Chu, Kaohsiung City (TW); Chih-Hsiang Chang, Taichung City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 1246 days.

(21) Appl. No.: 17/519,808

(22) Filed: Nov. 5, 2021

(65) Prior Publication Data

US 2022/0059550 A1 Feb. 24, 2022

Related U.S. Application Data

(63) Continuation-in-part of application No. 16/663,952, filed on Oct. 25, 2019, now Pat. No. 11,183,503.
(Continued)

(51) Int. Cl.
H10B 53/30 (2023.01)
H10B 51/10 (2023.01)
(Continued)

(52) U.S. Cl.
CPC ............. H10B 51/30 (2023.02); H10B 51/10 (2023.02); H10B 53/30 (2023.02); H10W 20/42 (2026.01); H10W 20/435 (2026.01)

(58) Field of Classification Search
CPC ........ H10B 53/10; H10B 53/30; H10B 63/30; G11C 11/221; G11C 11/5657;
(Continued)

(56) References Cited

U.S. PATENT DOCUMENTS 6,215,646 B1 4/2001 Ochiai et al.
6,686,620 B2 2/2004 An et al.
(Continued)

FOREIGN PATENT DOCUMENTS

KR 20050114042 A 12/2005
KR 20210016263 A 2/2021
WO 2013140768 A1 9/2013

OTHER PUBLICATIONS

Non-Final Office Action dated Mar. 24, 2021 for U.S. Appl. No. 16/663,952.
(Continued)

*Primary Examiner* — Younes Boulghassoul
(74) *Attorney, Agent, or Firm* — Eschweiler & Potashnik, LLC

(57) ABSTRACT

The present disclosure, in some embodiments, relates to an integrated chip. The integrated chip includes a lower insulating structure disposed over a lower dielectric structure surrounding an interconnect. The lower insulating structure has sidewalls extending through the lower insulating structure. A bottom electrode is arranged along the sidewalls and an upper surface of the lower insulating structure, a data storage structure is disposed on first interior sidewalls and an upper surface of the bottom electrode, and a top electrode is disposed on second interior sidewalls and an upper surface
(Continued)

of the data storage structure. An interconnect via is on an upper surface of the top electrode. A bottom surface of the bottom electrode is laterally outside of a bottom surface of the interconnect via.

20 Claims, 19 Drawing Sheets

Related U.S. Application Data

(60) Provisional application No. 63/220,683, filed on Jul. 12, 2021, provisional application No. 62/880,816, filed on Jul. 31, 2019.

(51) Int. Cl.
| | |
|---|---|
| *H10B 51/30* | (2023.01) |
| *H10W 20/41* | (2026.01) |
| *H10W 20/42* | (2026.01) |

(58) Field of Classification Search
CPC .... H10N 70/821; H10N 70/841; H10N 70/20; H10N 70/011; H10N 70/061; H10N 70/063
See application file for complete search history.

(56) References Cited

U.S. PATENT DOCUMENTS

| | | | | |
|---|---|---|---|---|
| 6,777,739 | B2 | 8/2004 | Agarwal et al. | |
| 7,132,300 | B2 | 11/2006 | Tatsunari et al. | |
| 7,642,099 | B2 | 1/2010 | Fukada et al. | |
| 9,431,603 | B1 | 8/2016 | Hsieh et al. | |
| 9,799,705 | B1* | 10/2017 | Yi | H10N 70/841 |
| 10,164,182 | B1* | 12/2018 | Trinh | H10N 70/24 |
| 10,176,866 | B1* | 1/2019 | Trinh | G11C 13/0007 |
| 10,439,134 | B2* | 10/2019 | Majhi | H10N 70/821 |
| 2001/0018237 | A1 | 8/2001 | Hartner et al. | |
| 2002/0153550 | A1* | 10/2002 | An | H10D 1/688 |
| | | | | 257/296 |
| 2005/0170599 | A1 | 8/2005 | Joo | |
| 2006/0292816 | A1 | 12/2006 | Mikawa et al. | |
| 2007/0114590 | A1 | 5/2007 | Ando et al. | |
| 2007/0221974 | A1 | 9/2007 | Celii et al. | |
| 2009/0261434 | A1 | 10/2009 | Kang et al. | |
| 2010/0051896 | A1 | 3/2010 | Park et al. | |
| 2010/0187584 | A1 | 7/2010 | Matsuda | |
| 2011/0169135 | A1 | 7/2011 | Nakao | |
| 2011/0272664 | A1* | 11/2011 | Tada | H10N 70/826 |
| | | | | 257/4 |
| 2014/0113430 | A1 | 4/2014 | Hayakawa et al. | |
| 2014/0131654 | A1 | 5/2014 | Tu et al. | |
| 2015/0060750 | A1 | 3/2015 | Sung et al. | |
| 2015/0090949 | A1* | 4/2015 | Chang | H10N 70/8265 |
| | | | | 257/4 |
| 2015/0144859 | A1 | 5/2015 | Chen et al. | |
| 2015/0221658 | A1 | 8/2015 | Wang | |
| 2015/0262864 | A1 | 9/2015 | Okamoto et al. | |
| 2015/0295172 | A1 | 10/2015 | Sung et al. | |
| 2015/0340609 | A1 | 11/2015 | Banno et al. | |
| 2016/0064391 | A1* | 3/2016 | Li | H10B 12/30 |
| | | | | 257/295 |
| 2016/0365513 | A1* | 12/2016 | Sung | H10N 70/20 |
| 2016/0380193 | A1 | 12/2016 | Chen et al. | |
| 2017/0117467 | A1 | 4/2017 | Chang et al. | |
| 2017/0207387 | A1* | 7/2017 | Yang | H10N 70/24 |
| 2019/0074440 | A1* | 3/2019 | Yang | H10N 50/01 |
| 2020/0006649 | A1 | 1/2020 | Jiang et al. | |
| 2020/0106011 | A1 | 4/2020 | Chen et al. | |
| 2020/0127189 | A1* | 4/2020 | Liao | H10B 61/22 |
| 2020/0395460 | A1 | 12/2020 | Haratipour et al. | |
| 2021/0035992 | A1 | 2/2021 | Chen et al. | |
| 2021/0184114 | A1 | 6/2021 | Chang et al. | |
| 2022/0328508 | A1* | 10/2022 | Lin | H10D 1/692 |
| 2022/0384464 | A1* | 12/2022 | Chen | H10D 1/682 |

OTHER PUBLICATIONS

Notice of Allowance dated Jul. 13, 2021 for U.S. Appl. No. 16/663,952.

Notice of Allowance dated Jun. 20, 2023 for U.S. Appl. No. 17/528,611.

Non-Final Office Action dated Dec. 15, 2022 for U.S. Appl. No. 17/528,611.

* cited by examiner

200B

300

700

800

900

1100D

1200

1800

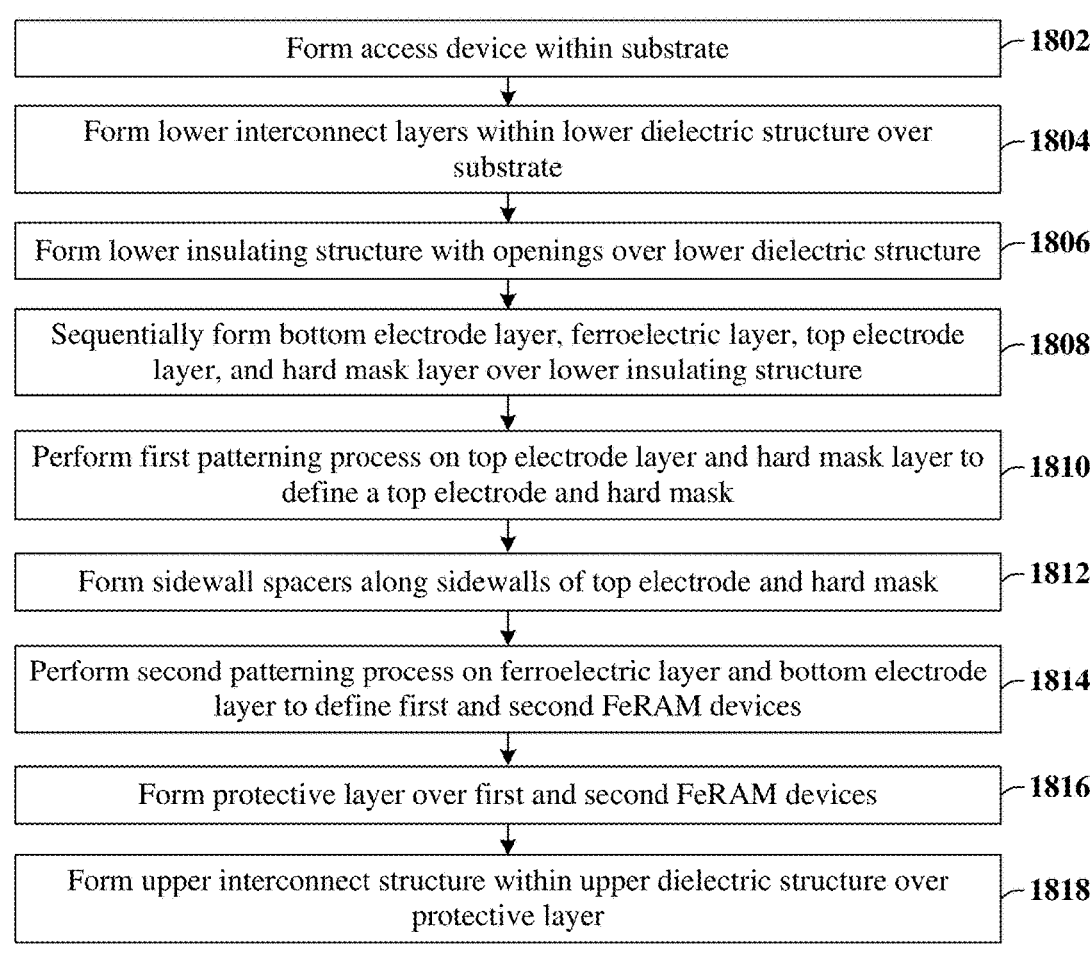

| Form access device within substrate | — 1802 |

| Form lower interconnect layers within lower dielectric structure over substrate | — 1804 |

| Form lower insulating structure with openings over lower dielectric structure | — 1806 |

| Sequentially form bottom electrode layer, ferroelectric layer, top electrode layer, and hard mask layer over lower insulating structure | — 1808 |

| Perform first patterning process on top electrode layer and hard mask layer to define a top electrode and hard mask | — 1810 |

| Form sidewall spacers along sidewalls of top electrode and hard mask | — 1812 |

| Perform second patterning process on ferroelectric layer and bottom electrode layer to define first and second FeRAM devices | — 1814 |

| Form protective layer over first and second FeRAM devices | — 1816 |

| Form upper interconnect structure within upper dielectric structure over protective layer | — 1818 |

Fig. 18

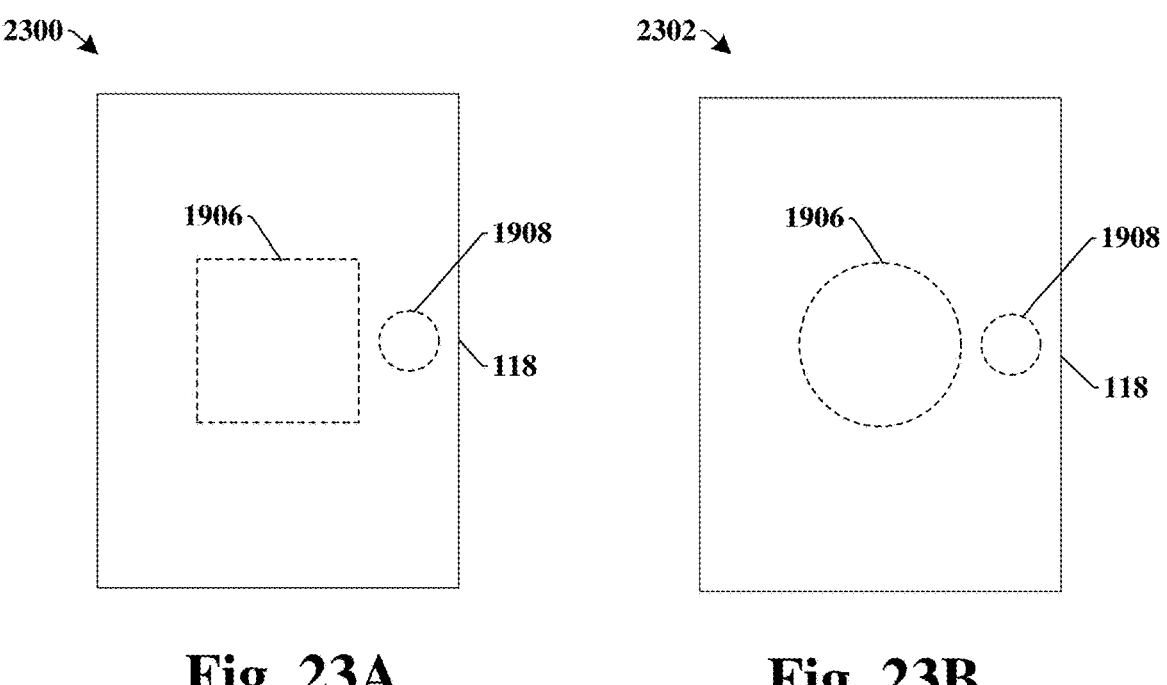
Fig. 23A　　　　Fig. 23B
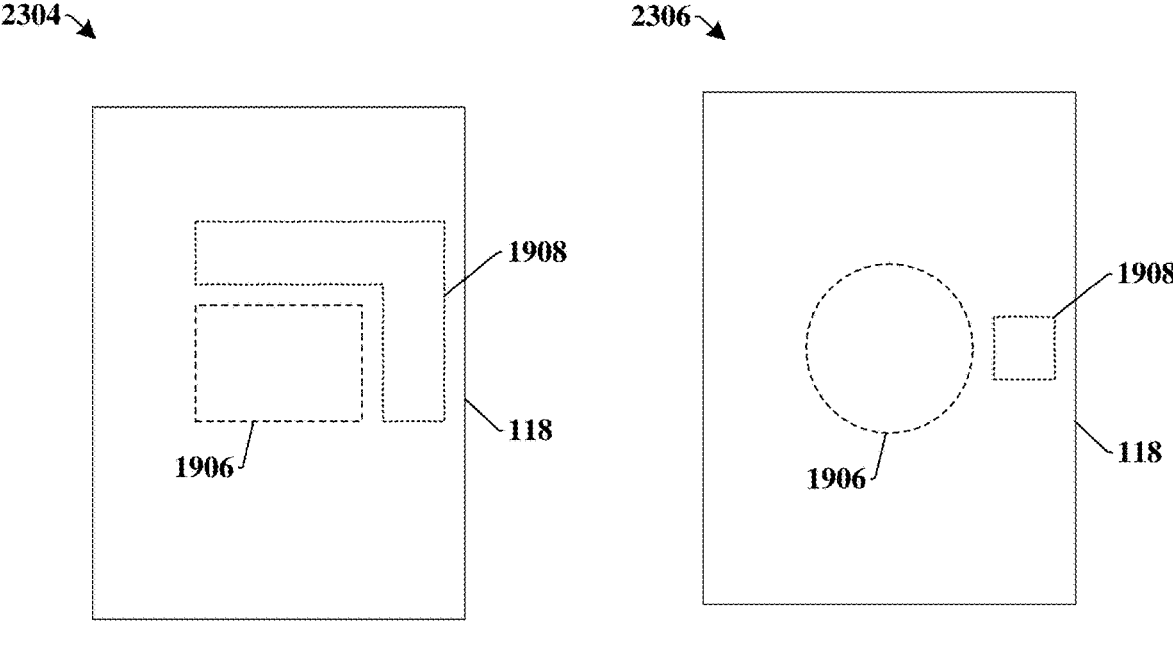
Fig. 23C　　　　Fig. 23D

METHOD OF FORMING A MEMORY CELL HAVING AN OFFSET INTERCONNECT VIA EXTENDING THROUGH A HARD MASK WITH VARIABLE THICKNESS

REFERENCE TO RELATED APPLICATIONS

This Application is a Continuation-in-Part of U.S. application Ser. No. 16/663,952, filed on Oct. 25, 2019, which claims the benefit of U.S. Provisional Application No. 62/880,816, filed on Jul. 31, 2019. Furthermore, this Application also claims the benefit of U.S. Provisional Application No. 63/220,683, filed on Jul. 12, 2021. The contents of the above-referenced Patent Applications are hereby incorporated by reference in their entirety.

BACKGROUND

Many modern day electronic devices contain electronic memory configured to store data. Electronic memory may be volatile memory or non-volatile memory. Volatile memory stores data when it is powered, while non-volatile memory is able to store data when power is removed. Ferroelectric random-access memory (FeRAM) devices are one promising candidate for a next generation non-volatile memory technology. This is because FeRAM devices provide for many advantages, including a fast write time, high endurance, low power consumption, and low susceptibility to damage from radiation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 18 illustrates a flow diagram of some embodiments of a method of forming an integrated chip having an FeRAM device without using a planarization process to define a bottom electrode of the FeRAM device.

FIGS. 23A-23D illustrate top-views of some additional embodiments of integrated chips having a memory device including a top electrode and a bottom electrode having a bottom surface that is off-centered from a bottom surface of an interconnect via contacting the top electrode.

DETAILED DESCRIPTION

Figure 1:
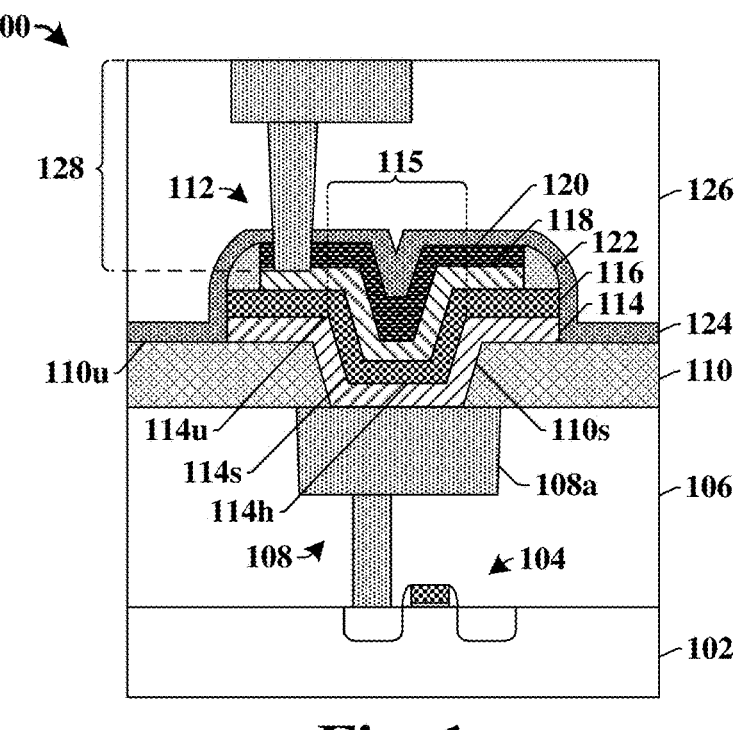
FIG. 1 illustrates a cross-sectional view of some embodiments of an integrated chip having a memory device including a bottom electrode comprising an upper surface with a recess.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Ferroelectric random access memory (FeRAM) devices have a bottom electrode that is separated from a top electrode by a ferroelectric material. The ferroelectric material has an intrinsic electric dipole that can be switched between opposite polarities by application of an external electric field. The different polarities provide the FeRAM device with different capacitances that are representative of different data states (e.g., a logical '0' or '1'), thereby allowing the FeRAM device to digitally store data. For example, during a read operation, the different capacitances can be sensed from a voltage on a bit-line attached to a FeRAM device, so as to output a data state stored by the FeRAM device.

FeRAM devices are typically formed by depositing a lower insulating structure over a dielectric structure that surrounds a plurality of interconnect layers. The lower insulating structure is patterned to form an opening that exposes one or more of the plurality of interconnect layers. A bottom electrode layer is formed within the opening and over the lower insulating structure. A chemical mechanical planarization (CMP) process is subsequently performed on the bottom electrode layer to define a substantially planar upper surface. A ferroelectric layer is formed over the substantially planar upper surface of the bottom electrode layer and a top electrode layer is formed over the ferroelectric layer. A first patterning process is performed on the top electrode layer and the ferroelectric layer to define a top electrode and ferroelectric structure. Sidewall spacers are then formed along sides of the top electrode, followed by a second patterning process to define a bottom electrode.

The cost of using a CMP process to form the bottom electrode significantly increases a cost of forming an FeRAM device, as CMP processes are relatively expensive processes. Furthermore, it has been appreciated that a residue of a slurry used by the CMP process may remain on a substrate after the CMP process is completed. The slurry residue can accumulate over alignment marks that are used during subsequent lithographic processes, thereby obscuring the alignment marks. By obscuring the alignment marks, a photolithography process window of overlying layers is decreased, leading to a lower yield and/or reliability of FeRAM devices.

The present disclosure, in some embodiments, relates to a method of forming an FeRAM device that does not use a CMP process to form a bottom electrode. By not using a CMP process to form the bottom electrode, a cost of forming the FeRAM device can be reduced and a photolithography process window of overlying layers can be improved. In some embodiments, the resulting FeRAM device comprises a bottom electrode that generally conforms to sidewalls and an upper surface of an underlying lower insulating structure, a ferroelectric material disposed over the bottom electrode, and a top electrode over the ferroelectric material. Because the bottom electrode is formed without using a CMP process, the bottom electrode has interior sidewalls that define a first recess disposed within an upper surface of the bottom electrode. The ferroelectric material and/or the top electrode are disposed within the first recess and may also have interior sidewalls defining additional recesses.

FIG. 1 illustrates a cross-sectional view of some embodiments of an integrated chip 100 having a memory device including a bottom electrode comprising an upper surface with a recess.

The integrated chip 100 comprises an access device 104 arranged within a substrate 102. In some embodiments, the access device 104 may comprise a transistor device (e.g., a MOSFET, a bi-polar junction transistor (BJT), a high electron mobility transistor (HEMT), or the like). In some embodiments, the substrate 102 may comprise a semiconductor material (e.g., silicon, germanium, or the like). A lower dielectric structure 106 is arranged over the substrate 102 and surrounds the access device 104. The lower dielectric structure 106 further surrounds a plurality of lower interconnect layers 108, which are electrically coupled to the access device 104. A lower insulating structure 110 is disposed over the lower dielectric structure 106. The lower insulating structure 110 comprises sidewalls 110s defining an opening over an interconnect structure 108a of the plurality of lower interconnect layers 108.

A memory device 112 is disposed within the opening and over an upper surface 110u of the lower insulating structure 110. The memory device 112 comprises a data storage structure 116 arranged between a bottom electrode 114 and a top electrode 118. The data storage structure 116 is configured to store either a first data state (e.g., a '0') or a second data state (e.g., a '1') depending upon bias voltages applied to the bottom electrode 114 and the top electrode 118. For example, to store the first data state within the data storage structure 116, a first set of bias conditions may be applied to the bottom electrode 114 and the top electrode 118. Alternatively, to store the second data state within the data storage structure 116, a second set of bias conditions may be applied to the bottom electrode 114 and the top electrode 118.

The bottom electrode 114 comprises a conductive material that generally conforms to an upper surface of the interconnect structure 108a, the sidewalls 110s of the lower insulating structure 110, and an upper surface of the lower insulating structure 110. Because the conductive material of the bottom electrode 114 generally conforms to underlying layers, the bottom electrode 114 has interior sidewalls 114s and a horizontally extending surface 114h that define a first recess 115 within an upper surface 114u of the bottom electrode 114. The data storage structure 116 and/or the top electrode 118 are disposed within the first recess 115. In some embodiments, the data storage structure 116 and/or the top electrode 118 may also have interior sidewalls defining additional recesses.

A hard mask 120 is disposed over the memory device 112 and sidewall spacers 122 extend along outermost sidewalls of the top electrode 118 and the hard mask 120. A protective layer 124 covers the hard mask 120, the sidewall spacers 122, and the lower insulating structure 110. In some embodiments, the hard mask 120 and the protective layer 124 may also have interior sidewalls defining additional recesses. An upper interconnect structure 128 is disposed within an upper dielectric structure 126 over the protective layer 124. The upper interconnect structure 128 extends from an upper surface of the upper dielectric structure 126 to the top electrode 118.

The first recess 115 within the upper surface of the bottom electrode 114 is indicative that the bottom electrode 114 was formed without the use of a planarization process (e.g., a CMP process). By forming the bottom electrode 114 without using a planarization process, the bottom electrode 114 is able to be formed at a lower cost in comparison to processes that use a CMP process to form a bottom electrode. Furthermore, a photolithography process window of overlying layers may also be improved in comparison to processes that use a CMP process to form a bottom electrode.

Figure 2A:
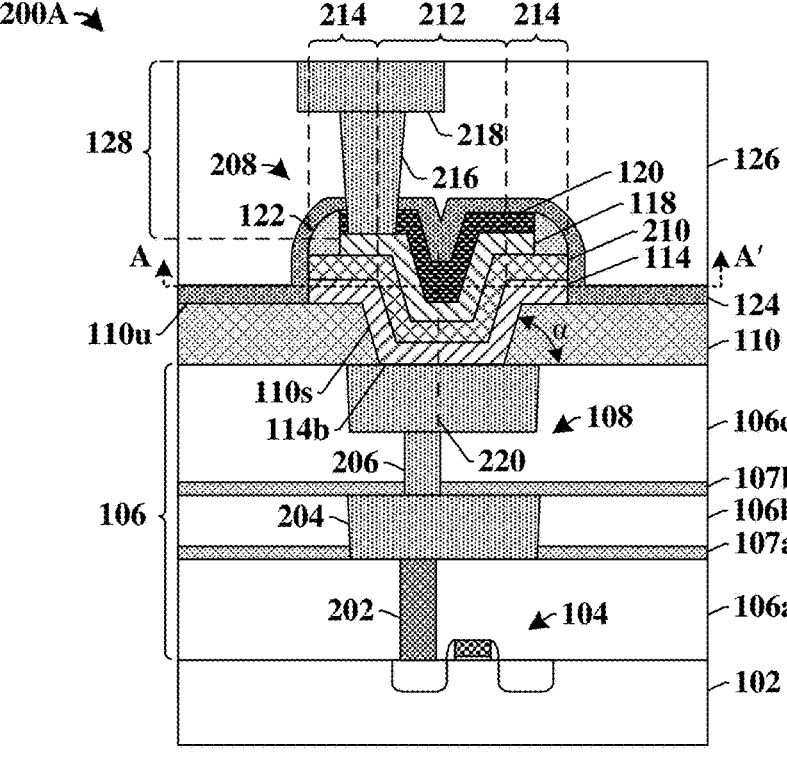
FIG. 2A illustrates a cross-sectional view of some embodiments of an integrated chip having a ferroelectric random-access memory (FeRAM) device including a bottom electrode comprising an upper surface with a recess.

FIG. 2A illustrates a cross-sectional view 200A of some embodiments of an integrated chip having a ferroelectric random access memory (FeRAM) device including a bottom electrode comprising an upper surface with a recess.

As shown in cross-sectional view 200A, the integrated chip comprises a lower dielectric structure 106 disposed over a substrate 102. The lower dielectric structure 106 comprises a plurality of lower inter-level dielectric (ILD) layers 106a-106c stacked onto one another and separated by etch stop layers 107a-107b. In some embodiments, the plurality of lower ILD layers 106a-106c may comprise one or more of silicon dioxide, doped silicon dioxide (e.g., carbon doped silicon dioxide), silicon oxynitride, borosilicate glass (BSG), phosphoric silicate glass (PSG), borophosphosilicate glass (BPSG), fluorinated silicate glass (FSG), or the like. In some embodiments, the etch stop layers 107a-107b may comprise silicon carbide, silicon nitride, titanium nitride, tantalum nitride, or the like.

A plurality of lower interconnect layers 108 are arranged within the lower dielectric structure 106. The plurality of lower interconnect layers 108 comprise conductive contacts 202, interconnect wires 204, and interconnect vias 206, respectively surrounded by one of the plurality of lower ILD layers 106a-106c. For example, the conductive contact 202 may be surrounded by a first lower ILD layer 106a, a first one of the interconnect wires 204 may be surrounded by a second lower ILD layer 106b, etc. In some embodiments, the interconnect wires 204 and the interconnect vias 206 respectively comprise a diffusion barrier layer surrounding a metal core. In some embodiments, the metal core may comprise copper, tungsten, aluminum, or the like. In some embodiments, the diffusion barrier layer may comprise titanium nitride, tantalum nitride, or the like. In some embodiments, the metal core and the diffusion barrier layer may have top surfaces that are substantially co-planar. In other embodiments, the diffusion barrier layer may vertically extend above outermost edges of the metal core.

A lower insulating structure 110 may be disposed over the plurality of lower ILD layers 106a-106c. In some embodiments, the lower insulating structure 110 may have a thickness in a range of between approximately 200 angstroms and approximately 400 angstroms. In other embodiments, the lower insulating structure 110 may have a thickness in a range of between approximately 225 angstroms and approximately 325 angstroms. The lower insulating structure 110 comprises sidewalls 110s defining an opening extending through the lower insulating structure 110. In some embodiments, the sidewalls 110s may be oriented at an acute angle $\alpha$ measured with respect to a bottom surface of the lower insulating structure 110. In some embodiments, a line extending between a top and a bottom of respective ones of the sidewalls 110s may be oriented at the acute angle $\alpha$ measured with respect to a bottom surface of the lower insulating structure 110. In some embodiments, the acute angle $\alpha$ is in a range of between approximately 40° and approximately 50°. In such embodiments, the acute angle $\alpha$ may limit gap fill issues during fabrication of an overlying memory device. Furthermore, the acute angle $\alpha$ provides for a good uniformity of the overlying layers that results in consistent performance of an overlying memory device. In various embodiments, the lower insulating structure 110 may comprise one or more of silicon oxynitride, silicon dioxide, silicon carbide, silicon nitride, Tetraethyl orthosilicate (TEOS), a low-κ dielectric, or the like.

An FeRAM device 208 is disposed over the lower insulating structure 110. The FeRAM device 208 comprises a ferroelectric material 210 arranged between a bottom electrode 114 and a top electrode 118. The bottom electrode 114, the ferroelectric material 210, and the top electrode 118 respectively have an inner region 212 laterally surrounded by an outer region 214. Layers within the inner region 212 respectively have a recessed horizontally extending surface arranged laterally between and vertically below upper surfaces of a corresponding layer within the outer region 214. For example, the bottom electrode 114 has a horizontally extending surface within the inner region 212 that is laterally between and vertically below upper surfaces of the bottom electrode 114 within the outer region 214.

Figure 2B:
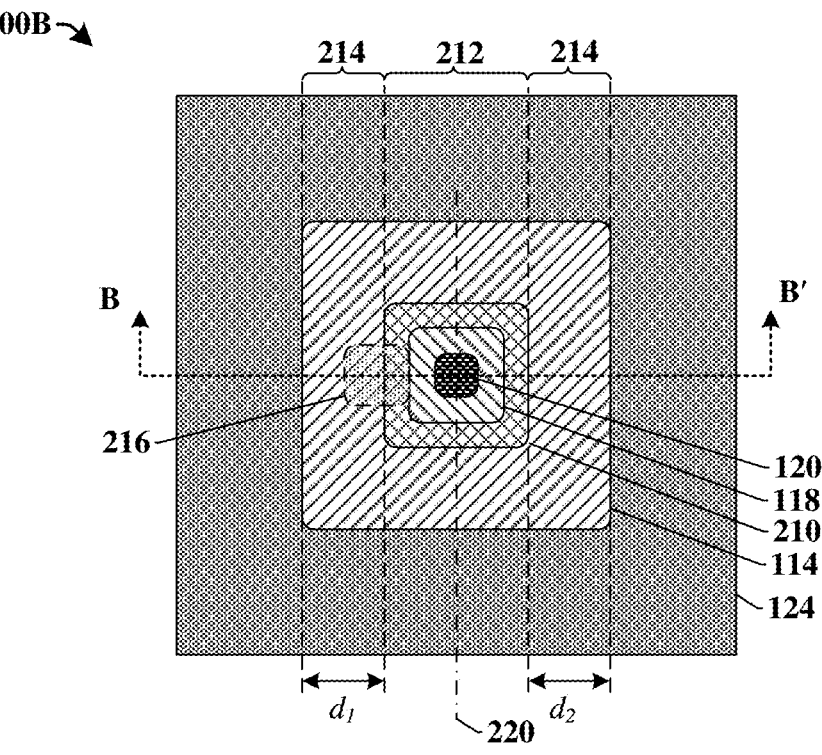
FIG. 2B illustrates a top-view of some embodiments of the integrated chip of FIG. 2A.

In some embodiments, shown in top-view 200B of FIG. 2B (taken along line A-A' of FIG. 2A), the outer region 214 may continually extend in an unbroken ring around the inner region 212 when viewed in a top-view of the FeRAM device 208. In some embodiments, the upper surface of the bottom electrode 114 extends in opposing directions past opposite edges of the inner region 212 by distances, $d_1$ and $d_2$, which are substantially equal. In some such embodiments, the bottom electrode 114 is substantially symmetric about a line 220 bisecting a bottommost surface of the bottom electrode 114. In other embodiments, the distances, $d_1$ and $d_2$, may be different, so that the bottom electrode 114 is asymmetric about line 220.

Referring again to cross-sectional view 200A of FIG. 2A (taken along line B-B' of FIG. 2B), the bottom electrode 114 continuously extends from a bottom surface 114b that is directly over the plurality of lower interconnect layers 108 to line the sidewalls 110s and an upper surface 110u of the lower insulating structure 110. The bottom electrode 114 has interior sidewalls disposed over the bottom surface 114b. The interior sidewalls are coupled to the horizontally extending surface to define a first recess within an upper surface of the bottom electrode 114. The ferroelectric material 210 is disposed within the first recess and lines the interior sidewalls and the upper surface of the bottom electrode 114. The ferroelectric material 210 has interior sidewalls that are disposed over the bottommost surface of the bottom electrode 114 and that define a second recess within the upper surface of the ferroelectric material 210. The top electrode 118 is disposed within the second recess and lines the interior sidewalls and the upper surface of the ferroelectric material 210. In some embodiments, the top electrode 118 has interior sidewalls that are disposed over the bottommost surface of the bottom electrode 114 and that define a third recess within the upper surface of the top electrode 118.

In some embodiments, the bottom electrode 114 and the top electrode 118 may comprise one or more of titanium, tantalum, tungsten, tantalum nitride, titanium nitride, or the like. In some embodiments, the ferroelectric material 210 may comprise a metal, a metal-oxynitride, or a compound-metal-oxide. For example, in various embodiments, the ferroelectric material 210 may comprise, lead titanate, lead zirconate titanate (PZT), lead lanthanum zirconate titanate, strontium bismuth tantalate (SBT), bismuth lanthanum titanate (BLT) and bismuth neodymium titanate (BNT), or the like.

In some embodiments, the bottom electrode 114, the ferroelectric material 210, and/or the top electrode 118 may respectively have a thickness that is in a range of between approximately 50 angstroms and approximately 150 angstroms. In other embodiments, the bottom electrode 114, the ferroelectric material 210, and/or the top electrode 118 may respectively have a thickness that is equal to approximately 100 angstroms. The stated thicknesses of the bottom electrode 114, the ferroelectric material 210, and/or the top electrode 118 prevent an overall height of the FeRAM device 208 from getting large enough to present process problems within other regions of an integrated chip (e.g., within a logic region) and/or within overlying layers of an integrated chip. In some embodiments, the bottom electrode 114, the ferroelectric material 210, and/or the top electrode 118 may respectively have a substantially equal thickness between outermost sidewalls. In some alternative embodiments, the inner region 212 of the bottom electrode 114, the ferroelectric material 210, and/or the top electrode 118 may have a first thickness and the outer region 214 of the bottom electrode 114, the ferroelectric material 210, and/or the top electrode 118 may have a second thickness that is less than the first thickness.

A hard mask 120 is disposed over the top electrode 118. Sidewall spacer 122 are disposed along opposing sides of the top electrode 118 and the hard mask 120. In some embodiments, the sidewall spacers 122 may comprise a same material as the hard mask 120. For example, in some embodiments the hard mask 120 and the sidewall spacers 122 may comprise a carbide (e.g., silicon carbide), a nitride (e.g., silicon nitride), an oxide (e.g., silicon oxy-nitride), or the like. In other embodiments, the sidewall spacers 122 may comprise a different material than the hard mask 120. In some such embodiments, the sidewall spacers 122 and hard mask 120 may extend to different heights (e.g., the hard mask 120 may have a top surface that is recessed below a top surface of the sidewall spacers 122, or vice versa).

A protective layer 124 is disposed over the sidewall spacers 122 and hard mask 120. The protective layer 124 continuously extends from over the hard mask 120 to the lower insulating structure 110. In some embodiments, the protective layer 124 may comprise a carbide, an oxide, a nitride, TEOS (Tetraethyl orthosilicate), or the like. In some embodiments, the hard mask 120 and the protective layer 124 may respectively have a thickness in a range of between approximately 50 angstroms and approximately 150 angstroms. In other embodiments, the hard mask 120 and the protective layer 124 may respectively have a thickness that is equal to approximately 100 angstroms.

An upper dielectric structure 126 is arranged over the protective layer 124. The upper dielectric structure 126 may extend to within a recess defined by sidewalls of the protective layer 124. An upper interconnect structure 128 is disposed within the upper dielectric structure 126. The upper interconnect structure 128 extends from an upper surface of the upper dielectric structure 126 to the top electrode 118. In some embodiments, the upper dielectric structure 126 may comprise a carbon doped silicon dioxide, silicon oxynitride, borosilicate glass (BSG), phosphoric silicate glass (PSG), borophosphosilicate glass (BPSG), fluorinated silicate glass (FSG), a porous dielectric material, or the like. In various embodiments, the upper interconnect structure 128 may comprise an interconnect via 216 (e.g., a top electrode via (TEVA)) and/or an interconnect wire 218. In some embodiments, the upper interconnect structure 128 may comprise a conductive material, such as copper, tungsten, and/or aluminum.

During operation, bias voltages may be applied to the bottom electrode 114 and/or the top electrode 118. For example, during a write operation, one or more bias voltages can be applied to cause charge carriers (e.g., electrons and/or holes) to accumulate in the bottom electrode 114 and/or the top electrode 118. The charge carriers generate electric fields, which extend through the ferroelectric material 210. The electric fields are configured to change positions of electric dipoles within the ferroelectric material 210 depending on the bias voltages. If the positions of electric dipoles within the ferroelectric material 210 define a first polarization, the FeRAM device 208 will digitally store data as a first bit value (e.g., a logical "0"). Alternatively, if the positions of electric dipoles within the ferroelectric material 210 define a second polarization, the FeRAM device 208 will digitally store data as a second bit value (e.g., a logical "1").

Figure 3:
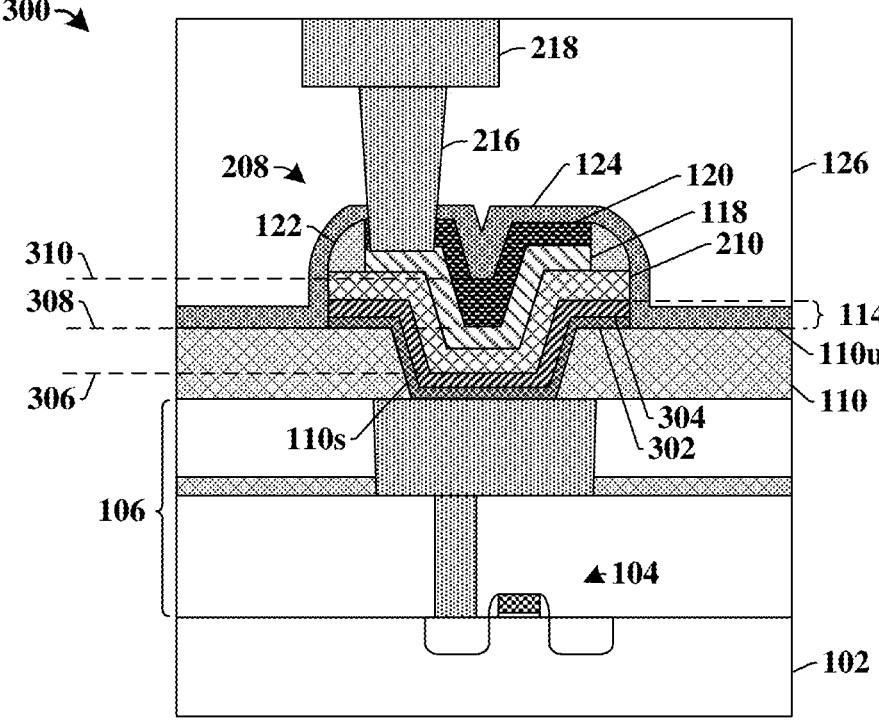
FIG. 3 illustrates a cross-sectional view of some additional embodiments of an integrated chip having an FeRAM device including a bottom electrode comprising an upper surface with a recess.

FIG. 3 illustrates a cross-sectional view of some embodiments of an integrated chip 300 having an FeRAM device including a bottom electrode comprising an upper surface with a recess.

The integrated chip 300 comprises an FeRAM device 208 disposed over a lower insulating structure 110 over a substrate 102. The FeRAM device 208 comprises a ferroelectric material 210 arranged between a bottom electrode 114 and a top electrode 118. In some embodiments, the bottom electrode 114 comprises a liner 302 and a conductive layer 304 disposed over the liner 302. The liner 302 extends along sidewalls and an upper surface of the lower insulating structure 110. In some embodiments, the liner 302 may comprise titanium nitride, tantalum nitride, or the like. In some embodiments, the conductive layer 304 may comprise titanium, tantalum, or the like.

The bottom electrode 114 has interior sidewalls disposed over a bottommost surface of the bottom electrode 114. The interior sidewalls are coupled between a horizontally extending surface of the bottom electrode 114 and an upper surface of the bottom electrode 114. In some embodiments, the horizontally extending surface of the bottom electrode 114 extends along a first horizontal plane 306 that intersects sidewalls 110s of the lower insulating structure 110. In some embodiments, the ferroelectric material 210 and the top electrode 118 continuously extend from directly above the lower insulating structure 110 to positions below a second horizontal plane 308 extending along an upper surface 110u of the lower insulating structure 110. By keeping the ferroelectric material 210 and the top electrode 118 below the second horizontal plane 308, a height of the FeRAM device 208 can be kept relatively low, thereby mitigating process problems on layers overlying the FeRAM device.

A hard mask 120 is disposed over the top electrode 118. The hard mask 120 comprises interior sidewalls that are coupled to a horizontally extending surface. In some embodiments, the horizontally extending surface extends along a third horizontal plane 310 that is below lower surfaces of the top electrode 118. In other embodiments (not shown), the third horizontal plane 310 may be above a top surface of the top electrode 118.

Figure 4A:
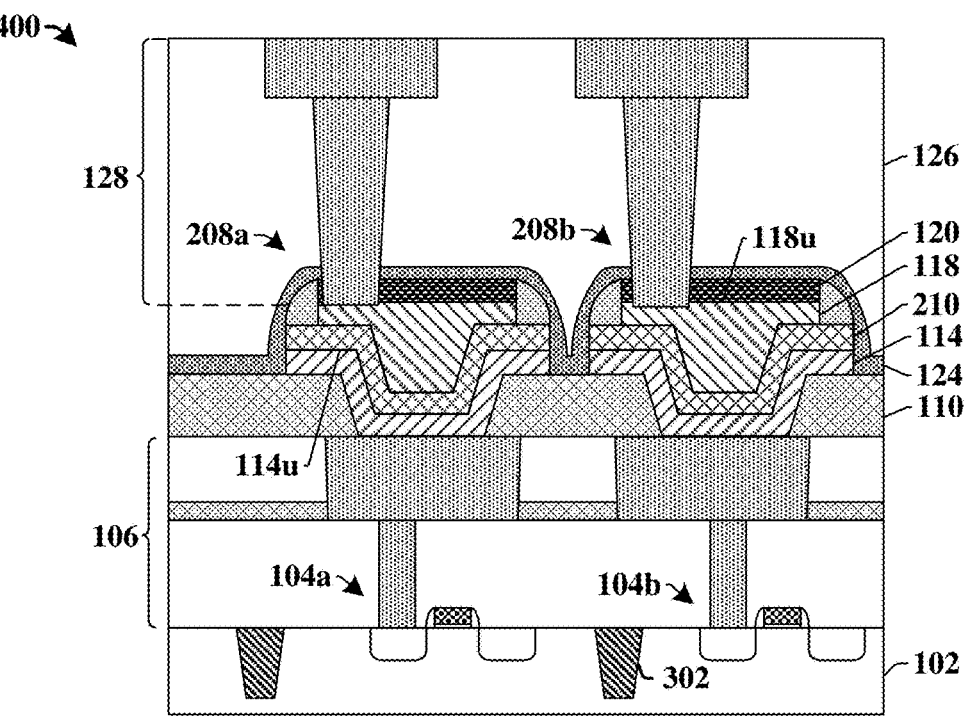
FIGS. 4A-4B illustrate cross-sectional views of some additional embodiments of integrated chips having an FeRAM device including a bottom electrode comprising an upper surface with a recess
Figure 4B:
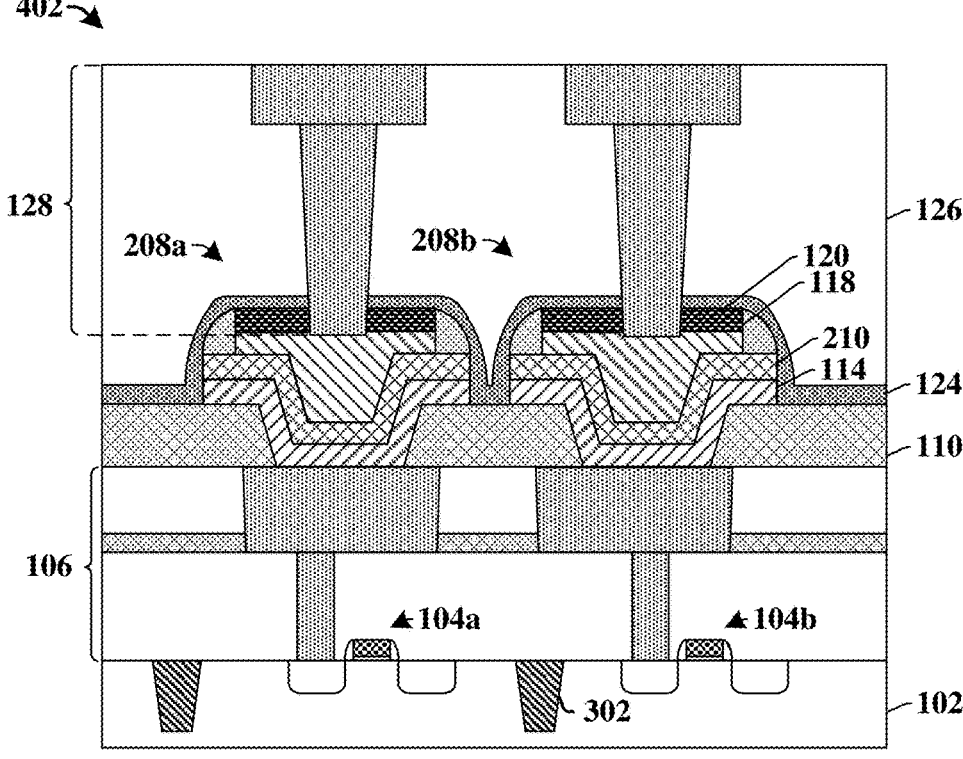

FIGS. 4A-4B illustrate cross-sectional views of some embodiments of integrated chips having an FeRAM device including a bottom electrode comprising an upper surface with a recess.

As shown in FIG. 4A, an integrated chip 400 comprises a first access device 104a and a second access device 104b disposed within a substrate 102. A first FeRAM device 208a is coupled to the first access device 104a and a second FeRAM device 208b is coupled to the second access device 104b. The first FeRAM device 208a and the second FeRAM device 208b respectively have a ferroelectric material 210 disposed between a bottom electrode 114 and a top electrode 118. The bottom electrode 114 has sidewalls that define a first recess within an upper surface of the bottom electrode 114. The ferroelectric material 210 has sidewalls that define a second recess within an upper surface of the ferroelectric material 210. The top electrode 118 is disposed within the second recess and completely fills the second recess. The top electrode 118 has an upper surface that is completely over the ferroelectric material 210. In some embodiments, the top electrode 118 has a substantially flat upper surface that continuously extends over the second recess.

An upper interconnect structure 128 extends through an upper dielectric structure 126 disposed over the first FeRAM device 208a to contact the top electrode 118. In some embodiments, the upper interconnect structure 128 may contact the top electrode 118 at a position that is directly over an upper surface 114*u* of the bottom electrode 114. In some additional embodiments, the upper interconnect structure 128 may contact the top electrode 118 at a position that is laterally straddles an outer edge of the upper surface 114*u* of the bottom electrode 114. In yet other embodiments, shown in FIG. 4B, an integrated chip 402 comprises upper interconnect structure 128 contacting the top electrode 118 at a position that is confined directly over the recess within the bottom electrode 114. It will be appreciated that having the upper interconnect structure 128 contact the top electrode 118 at a position that is directly over the recess within the bottom electrode can mitigate the risks associated with overlay errors during lithographic processes used to form the upper interconnect structure 128.

Figure 5:
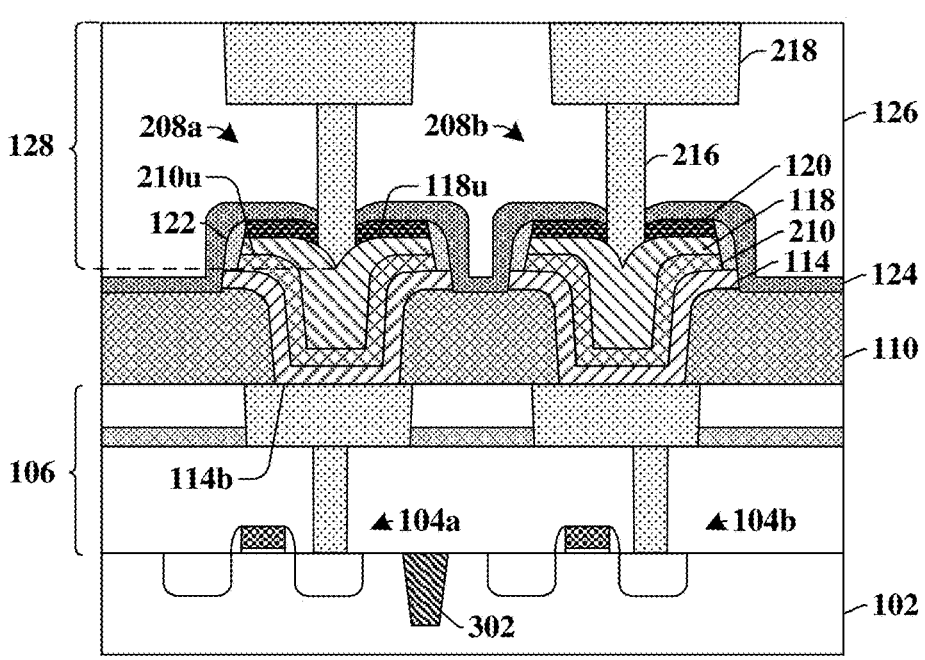
FIG. 5 illustrates a cross-sectional view of some additional embodiments of an integrated chip having an FeRAM device including a bottom electrode comprising an upper surface with a recess.

FIG. 5 illustrates a cross-sectional view of some embodiments of an integrated chip 500 having an FeRAM device including a bottom electrode comprising an upper surface with a recess.

The integrated chip 500 comprises FeRAM devices 208*a*-208*b*, respectively comprising a ferroelectric material 210 disposed between a bottom electrode 114 and a top electrode 118. A hard mask 120 and a protective layer 124 are disposed over the FeRAM devices 208*a*-208*b*.

The top electrode 118 has an upper surface 118*u* that laterally extends from directly over an upper surface 210*u* of the ferroelectric material 210 to directly over the bottom surface 114*b* of the bottom electrode 114. In some embodiments, the upper surface 118*u* of the top electrode 118 is arranged completely above a top of the bottom electrode 114. In some additional embodiments, the upper surface 118*u* of the top electrode 118 may also be completely above a top of the ferroelectric material 210. In such embodiments, the top electrode 118 completely fills a recess within the upper surface 210*u* of the ferroelectric material 210. In some embodiments, the upper surface 118*u* of the top electrode 118 is a curved surface.

An upper interconnect structure 128 extends through the hard mask 120 and the protective layer 124 to contact the top electrode 118. In some embodiments, the upper interconnect structure 128 may contact the top electrode 118 at a location that is directly over the bottom surface 114*b* of the bottom electrode 114. In such embodiments, the upper surface 118*u* of the top electrode 118 may be sloped so as to intersect sidewalls of the top electrode 118 at a non-zero angle measured with respect to a horizontal plane. In some embodiments, the hard mask 120 and the protective layer 124 may also have upper surfaces that are sloped so as to intersect the sidewalls of the top electrode 118 at non-zero angles measured with respect to horizontal planes. In other embodiments (not shown), the upper interconnect structure 128 may contact the top electrode 118 at a position that is laterally offset from a lowest point along the upper surface 118*u* of the top electrode 118.

Figure 6:
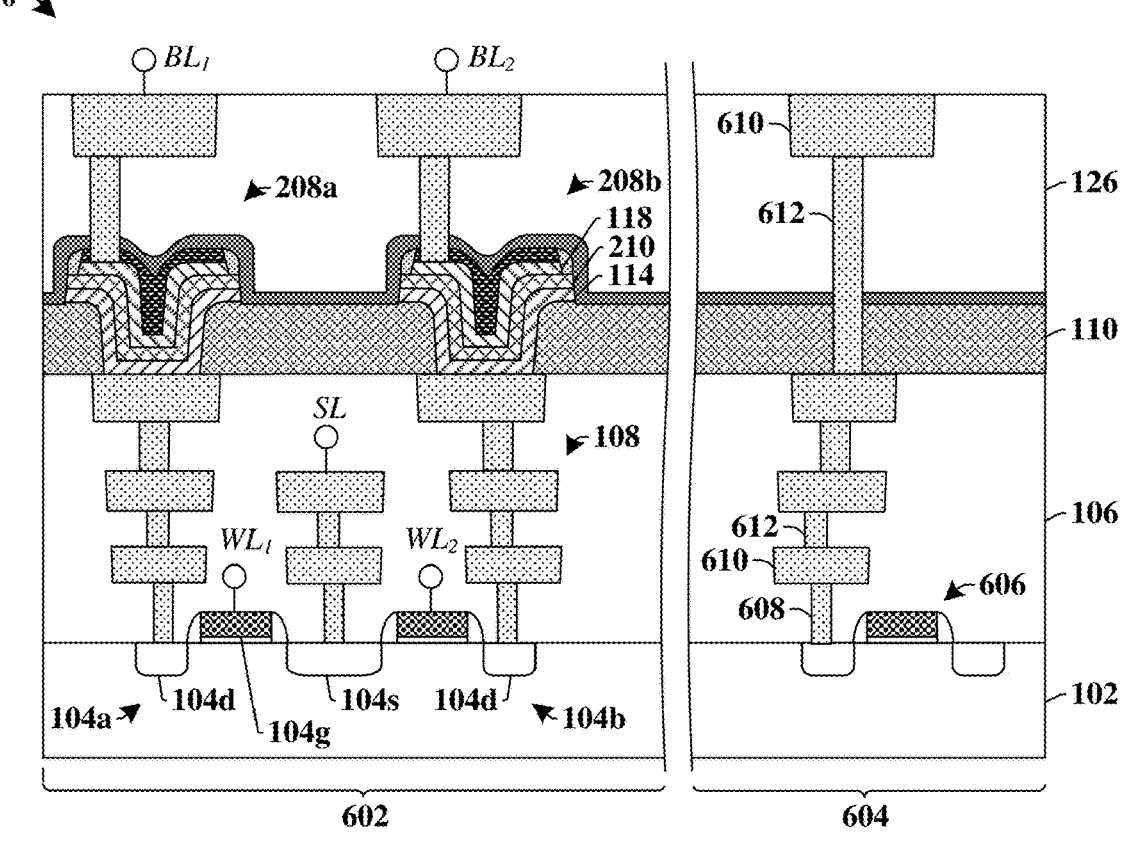
FIG. 6 illustrates a cross-sectional view of some additional embodiments of an integrated chip having an FeRAM device including a bottom electrode comprising an upper surface with a recess.

FIG. 6 illustrates a cross-sectional view of some embodiments of an integrated chip 600 having an FeRAM device including a bottom electrode comprising an upper surface with a recess.

The integrated chip 600 comprises a substrate 102 including an embedded memory region 602 and a logic region 604. Within the embedded memory region 602, a plurality of lower interconnect layers 108 are disposed within a lower dielectric structure 106. The plurality of lower interconnect layers 108 are coupled between access devices 104*a*-104*b* arranged within the substrate 102 and FeRAM devices 208*a*-208*b* arranged over a lower insulating structure 110. The FeRAM devices 208*a*-208*b* respectively comprise a ferroelectric material 210 disposed between a bottom electrode 114 and a top electrode 118.

In some embodiments, the access devices 104*a*-104*b* respectively comprise a gate electrode 104*g* arranged vertically over the substrate 102 and laterally between a source region 104*s* and a drain region 104*d*. The gate electrode 104*g* may be coupled to a word-line, $WL_1$ or $WL_2$, while the source region 104*s* may be coupled to a source line SL. The drain region 104*d* is coupled to one of the FeRAM device, 208*a* or 208*b*, which is further coupled to a bit-line, $BL_1$ or $BL_2$.

Within the logic region 604, one or more additional interconnect layers 608-612 are disposed within the lower dielectric structure 106 over the substrate 102. The one or more additional interconnect layers 608-612 comprise a conductive contact 608, an interconnect wire 610, and an interconnect via 612. The one or more additional interconnect layers 608-612 are coupled to a logic device 606 arranged within the substrate 102. In some embodiments, the logic device 606 may comprise a transistor device (e.g., a MOSFET, a bi-polar junction transistor (BJT), a high electron mobility transistor (HEMT), or the like).

FIGS. 7-17 illustrate cross-sectional views 700-1700 of some embodiments of a method of forming an integrated chip having an FeRAM device without using a planarization process to define a bottom electrode of the FeRAM device. Although FIGS. 7-17 are described in relation to a method, it will be appreciated that the structures disclosed in FIGS. 7-17 are not limited to such a method, but instead may stand alone as structures independent of the method.

Figure 7:
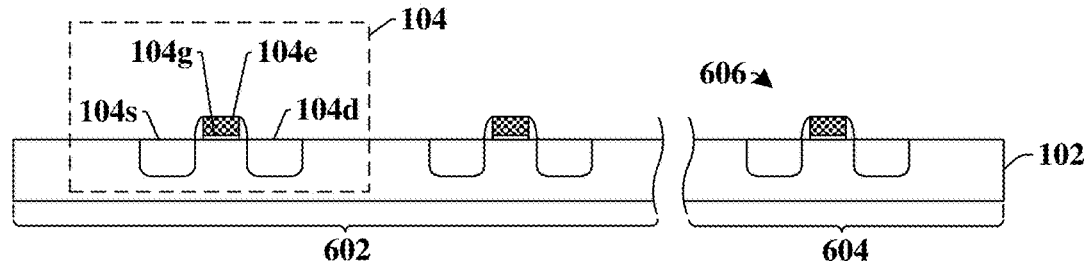
FIGS. 7-17 illustrate cross-sectional views of some embodiments of a method of forming an integrated chip having an FeRAM device without using a planarization process to define a bottom electrode of the FeRAM device.

As shown in cross-sectional view 700 of FIG. 7, a substrate 102 is provided. The substrate 102 comprises an embedded memory region 602 and a logic region 604. An access device 104 is formed within the embedded memory region 602 of the substrate 102 and a logic device 606 is formed within the logic region 604 of the substrate 102. In various embodiments, the substrate 102 may be any type of semiconductor body (e.g., silicon, SiGe, SOI, etc.), such as a semiconductor wafer and/or one or more die on a wafer, as well as any other type of semiconductor and/or epitaxial layers, associated therewith. In some embodiments, the access device 104 and/or the logic device 606 may comprise a transistor. In some such embodiments, the access device 104 and/or the logic device 606 may be formed by depositing a gate dielectric film and a gate electrode film over the substrate 102. The gate dielectric film and the gate electrode film are subsequently patterned to form a gate dielectric (e.g., 104*g*) and a gate electrode (e.g., 104*e*). The substrate 102 may be subsequently implanted to form a source region (e.g., 104*s*) and a drain region (e.g., 104*d*) within the substrate 102 on opposing sides of the gate electrode (e.g., 104*e*).

Figure 8:
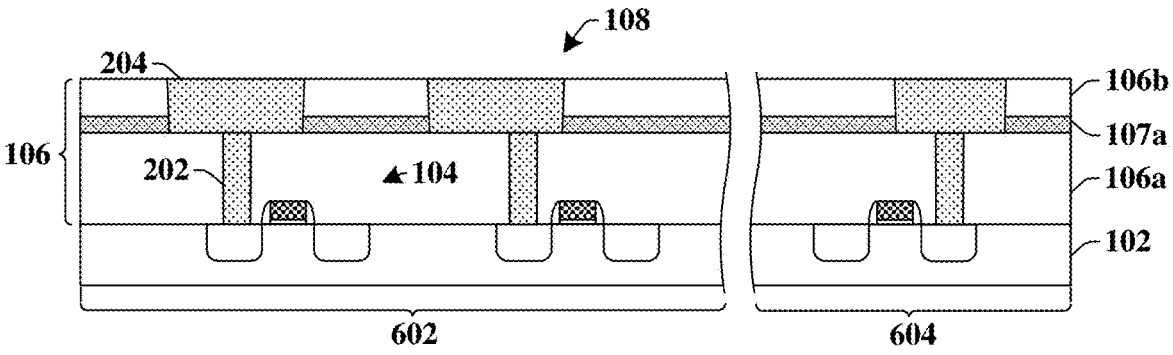

As shown in cross-sectional view 800 of FIG. 8, a plurality of lower interconnect layers 108 are formed within a lower dielectric structure 106 comprising one or more lower inter-level dielectric (ILD) layers 106*a*-106*b* over the substrate 102. In some embodiments, the one or more lower ILD layers 106*a*-106*b* may comprise a first lower ILD layer 106*a* and a second lower ILD layer 106*b* separated by a first etch stop layer 107*a*. In some embodiments, the plurality of lower interconnect layers 108 may comprise a conductive contact 202 and an interconnect wire 204. In some additional embodiments (not shown), the plurality of lower interconnect layers 108 may further comprise an interconnect via. The plurality of lower interconnect layers 108 may be formed by forming one of the one or more lower ILD layers 106*a*-106*b* (e.g., an oxide, a low-k dielectric, or an ultra low-k dielectric) over the substrate 102, selectively etching the lower ILD layer to define a via hole and/or a trench within the lower ILD layer, forming a conductive material (e.g., copper, aluminum, tungsten, etc.) within the via hole and/or a trench, and performing a planarization process (e.g., a chemical mechanical planarization (CMP) process).

Figure 9:
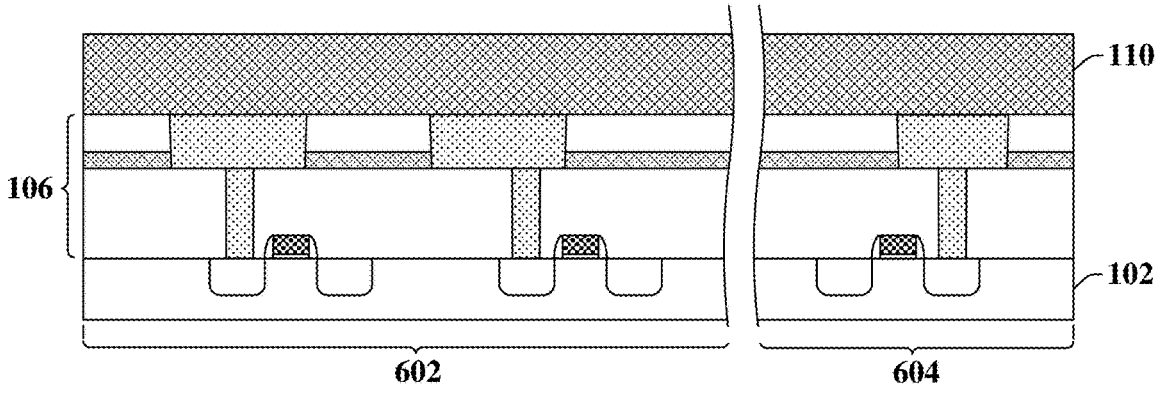

As shown in cross-sectional view 900 of FIG. 9, a lower insulating structure 110 is formed over the lower dielectric structure 106. In some embodiments, the lower insulating structure 110 may comprise one or more of an oxide, silicon nitride, silicon carbide, silicon oxynitride, TEOS, a metal oxide, a metal nitride, a metal carbide, or the like. In some embodiments, the lower insulating structure 110 may be formed by one or more different deposition processes (e.g., physical vapor deposition (PVD), chemical vapor deposition (CVD), PE-CVD, atomic layer deposition (ALD), sputtering, etc.) to a thickness in a range of between approximately 200 angstroms and approximately 400 angstroms.

Figure 10:
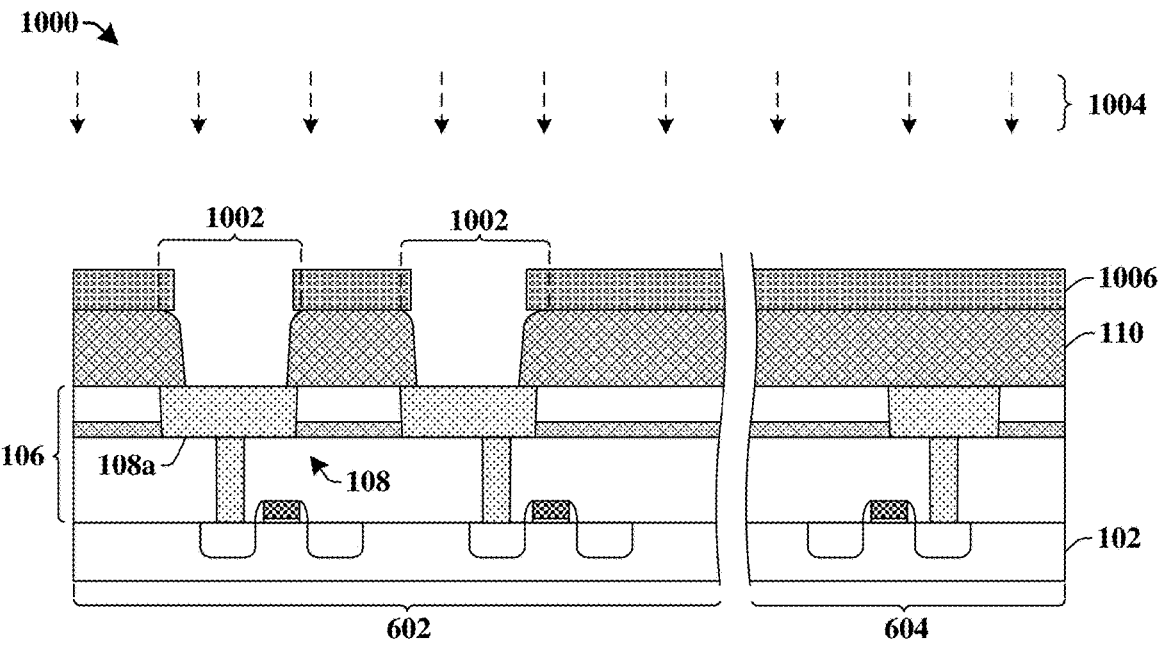

As shown in cross-sectional view 1000 of FIG. 10, the lower insulating structure 110 is selectively patterned to define a plurality of openings 1002 extending through the lower insulating structure 110. The plurality of openings 1002 expose an interconnect structure 108a of the plurality of lower interconnect layers 108. In some embodiments, the lower insulating structure 110 may be selectively patterned by exposing the lower insulating structure 110 to an etchant 1004 according to a patterned masking layer 1006 disposed on the lower insulating structure 110. In some embodiments, the patterned masking layer 1006 may comprise a photoresist material, a hard mask, or the like. In some embodiments, the etchant 1004 may comprise a dry etchant (e.g., comprising fluorine or chlorine).

Figure 11A:
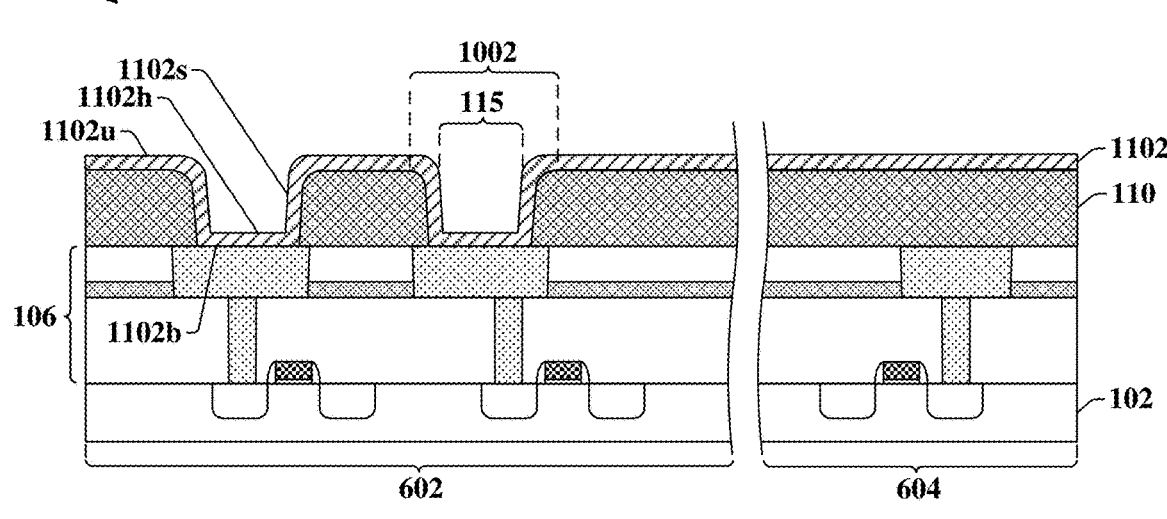

As shown in cross-sectional view 1100A of FIG. 11A, a bottom electrode layer 1102 is formed over the lower insulating structure 110 and within the openings 1002. The bottom electrode layer 1102 extends through the lower insulating structure 110 to the interconnect structure 108a. The bottom electrode layer 1102 has sidewalls 1102s and a horizontally extending surface 1102h that define a first recess 115 within an upper surface 1102u of the bottom electrode layer 1102. The first recess 115 is directly over a bottommost surface 1102b of the bottom electrode layer 1102. In some embodiments, the bottom electrode layer 1102 may be formed by depositing a liner followed by depositing a conductive material. In some such embodiments, the liner may be formed over the lower insulating structure 110 and within the openings 1002 prior to forming the conductive material over the liner and within the openings 1002. In some embodiments, the conductive material may comprise one or more of tantalum, tantalum nitride, titanium, titanium nitride, tungsten, platinum, or the like. In various embodiments, the liner may comprise a glue layer configured to increase adhesion between adjacent layers and/or a diffusion barrier layer configured to prevent diffusion between adjacent layers. In some embodiments, the liner may comprise one or more of titanium nitride, platinum, aluminum copper, gold, titanium, tantalum, tungsten, tungsten nitride, or the like.

Figure 11B:
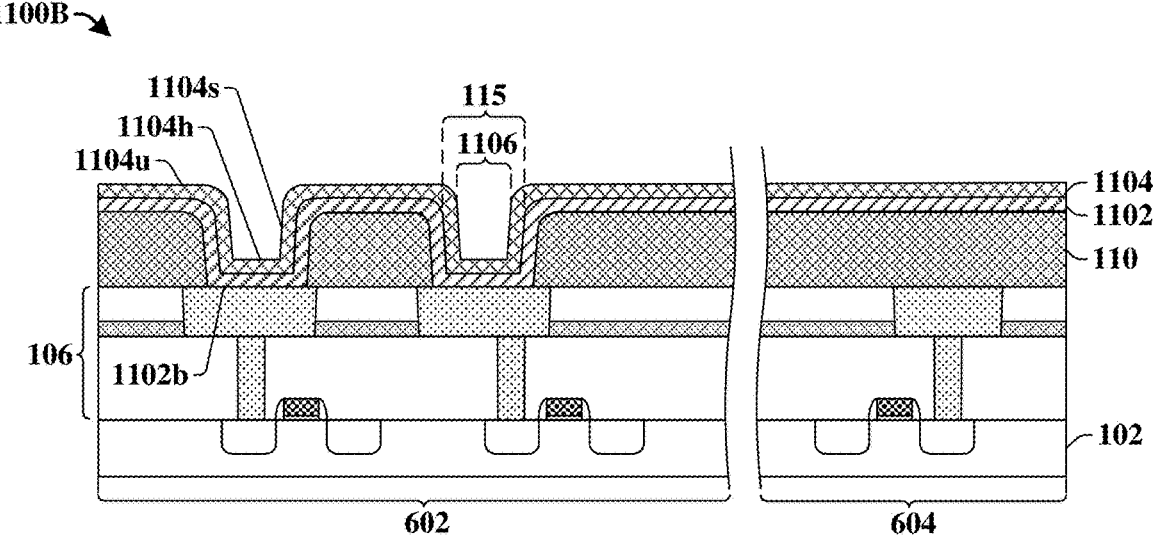

As shown in cross-sectional view 1100B of FIG. 11B, a data storage layer is formed over the bottom electrode layer 1102 and within the first recess (115 of FIG. 11A). In some embodiments, the data storage layer may comprise a ferroelectric layer 1104 formed over the bottom electrode layer 1102 and within the first recess (115 of FIG. 11A). The ferroelectric layer 1104 has sidewalls 1104s and a horizontally extending surface 1104h that define a second recess 1106 within an upper surface 1104u of the ferroelectric layer 1104 and directly over the bottommost surface 1102b of the bottom electrode layer 1102. In some embodiments, the ferroelectric layer 1104 may comprise a binary oxide, a ternary oxide, a quaternary oxide, or the like. In some embodiments, the ferroelectric layer 1104 may comprise hafnium oxide doped with silicon, zirconium, gadolinium, or the like.

Figure 11C:
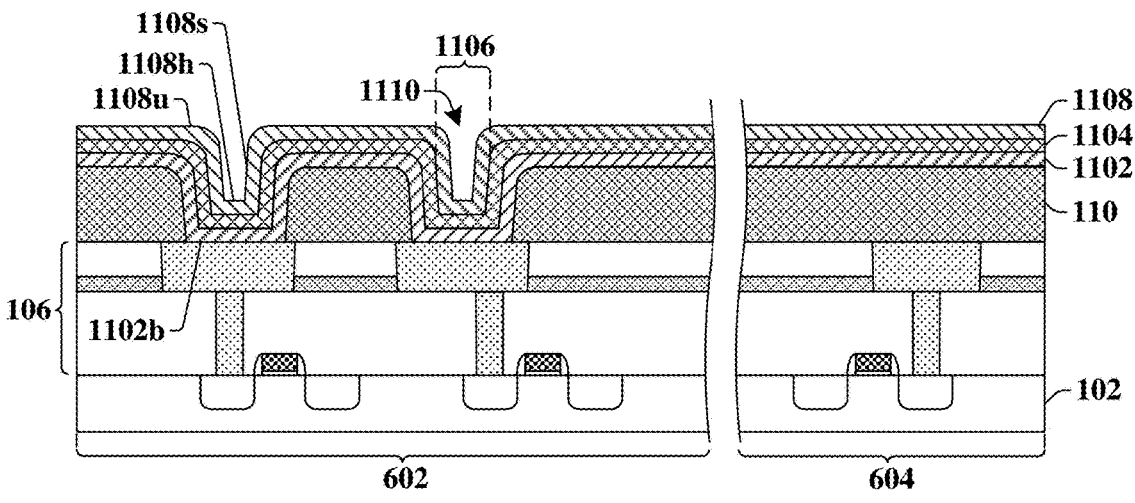

As shown in cross-sectional view 1100C of FIG. 11C, a top electrode layer 1108 is formed over the ferroelectric layer 1104 and within the second recess (1106 of FIG. 11B). The top electrode layer 1108 has sidewalls 1108s and a horizontally extending surface 1108h that define a third recess 1110 within an upper surface 1108u of the top electrode layer 1108 and directly over the bottommost surface 1102b of the bottom electrode layer 1102. In some embodiments, the top electrode layer 1108 may comprise one or more of tantalum, tantalum nitride, titanium, titanium nitride, tungsten, platinum, or the like.

Figure 11D:
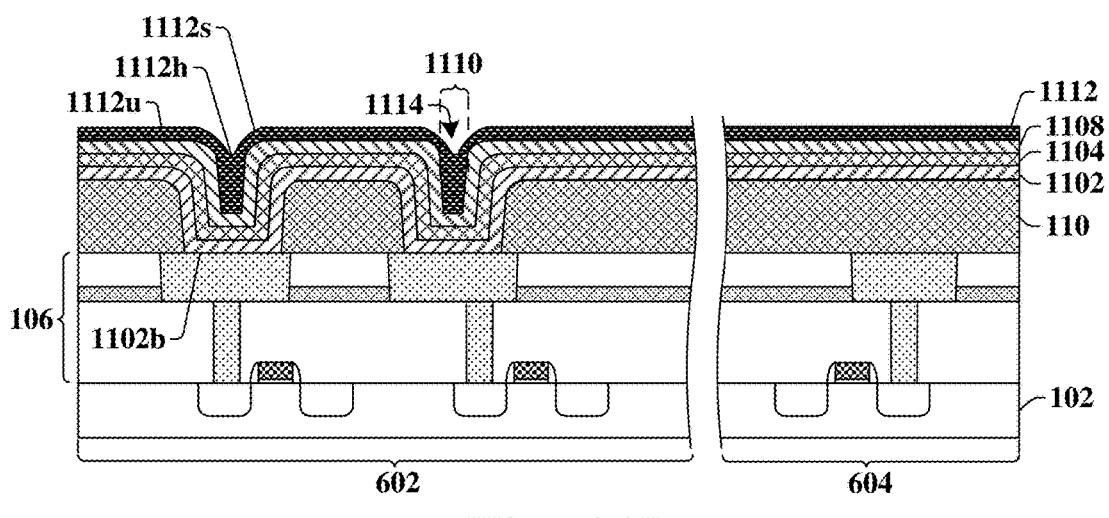

As shown in cross-sectional view 1100D of FIG. 11D, a hard mask layer 1112 is formed over the top electrode layer 1108 and within the third recess (1110 of FIG. 11C). In some embodiments, the hard mask layer 1112 has sidewalls 1112s and a horizontally extending surface 1112h that define a fourth recess 1114 within an upper surface 1112u of the hard mask layer 1112 and directly over the bottommost surface 1102b of the bottom electrode layer 1102. In other embodiments (not shown), the sidewalls 1112s of the hard mask layer 1112 may meet at a point, which is directly over the bottommost surface 1102b of the bottom electrode layer 1102, to define the fourth recess 1114. In some embodiments, the hard mask layer 1112 may comprise one or more of titanium nitride, silicon oxide, silicon nitride, silicon carbon nitride, a metal oxide (e.g., titanium oxide, aluminum oxide, etc.), or the like.

Figure 12:
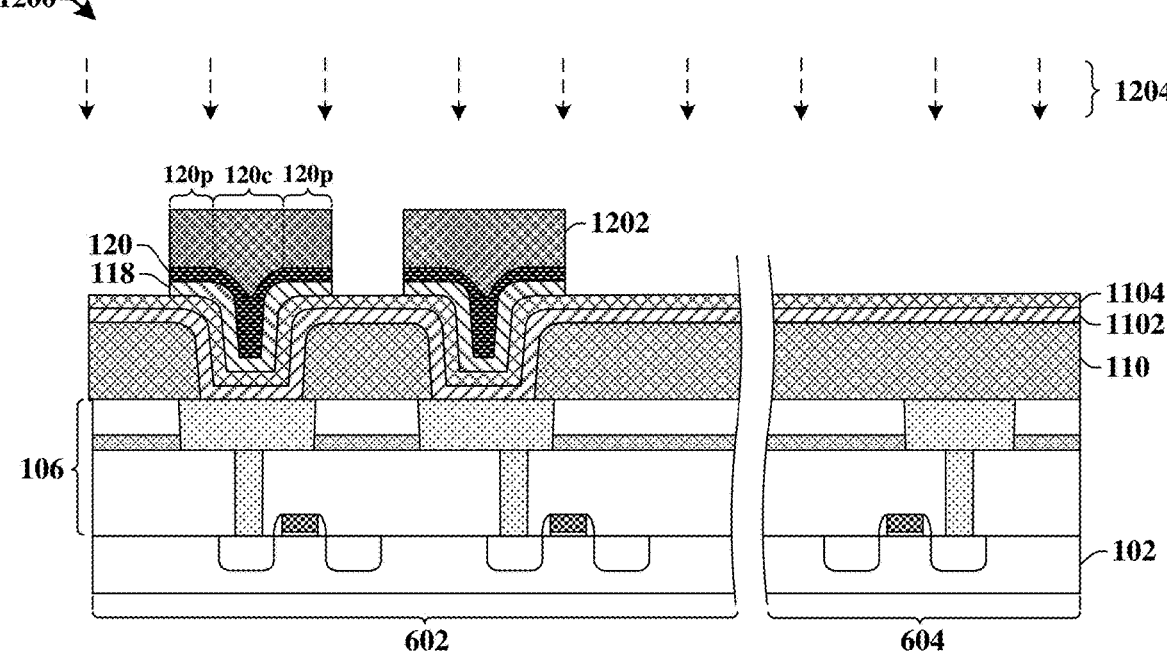

As shown in cross-sectional view 1200 of FIG. 12, a first patterning process is performed to define a top electrode 118 and a hard mask 120. The first patterning process selectively exposes the hard mask layer (1112 of FIG. 11D) and the top electrode layer (1108 of FIG. 11D) to an etchant 1204 according to a masking layer 1202 (e.g., a photoresist material, a hard mask, or the like) to define the top electrode 118 and the hard mask 120.

In some embodiments, after the first patterning process is completed the hard mask 120 has a central region 120c and a peripheral region 120p that surrounds the central region 120c. In some embodiments, the central region 120c may be a part of the hard mask 120 that is directly over the third recess (1110 of FIG. 11C). In some embodiments, the hard mask 120 may have a thickness that varies within the central region 120c of the hard mask 120, while the hard mask 120 may have a thickness that is substantially constant over the peripheral region 120p. The variations in thickness within the central region 120c cause the hard mask 120 to have different thicknesses at different lateral positions within the central region 120c, as viewed along the cross-sectional view 1200. In some embodiments, the variations of the thickness within the central region 120c of the hard mask 120 may be due to an uneven deposition of the hard mask layer (1112 of FIG. 11D) over recesses within the bottom electrode layer 1102, the ferroelectric layer 1104, and the top electrode layer (1106 of FIG. 11C), which result from the formation of the respective layers without using a planarization process (e.g., a CMP process).

Figure 13:
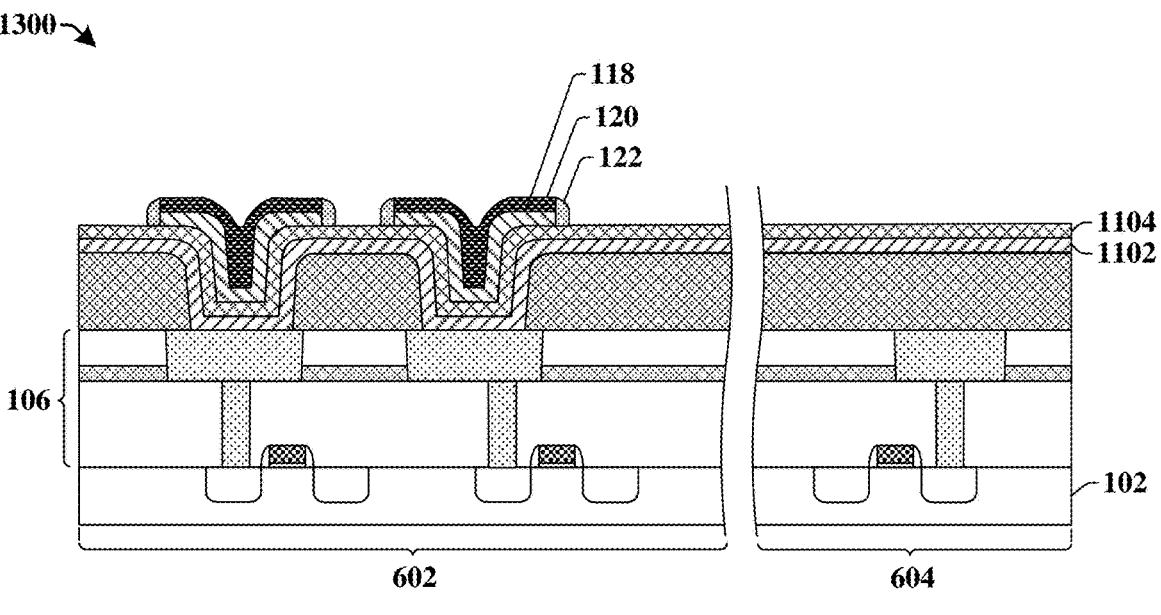

As shown in cross-sectional view 1300 of FIG. 13, sidewall spacers 122 are formed along sidewalls of the top electrode 118 and the hard mask 120. In some embodiments, the sidewall spacers 122 may completely cover sidewalls of the top electrode 118 and/or the hard mask 120. In various embodiments, the sidewall spacers 122 may comprise titanium nitride, silicon oxide, silicon nitride, a silicon dioxide, silicon carbon nitride, silicon oxy-nitride, a metal oxide (e.g., titanium oxide, aluminum oxide, etc.), or the like. In some embodiments, the sidewall spacers 122 may be formed by forming a spacer layer over the substrate. In some embodiments, the spacer layer may be formed using a deposition technique (e.g., PVD, CVD, PE-CVD, ALD, sputtering, etc.). The spacer layer is subsequently exposed to an etchant (e.g., a dry etchant), which removes the spacer layer from horizontal surfaces. Removing the spacer layer from horizontal surfaces leaves a part of the spacer layer along opposing sides of the top electrode 118 and the hard mask 120 as the sidewall spacers 122.

Figure 14:
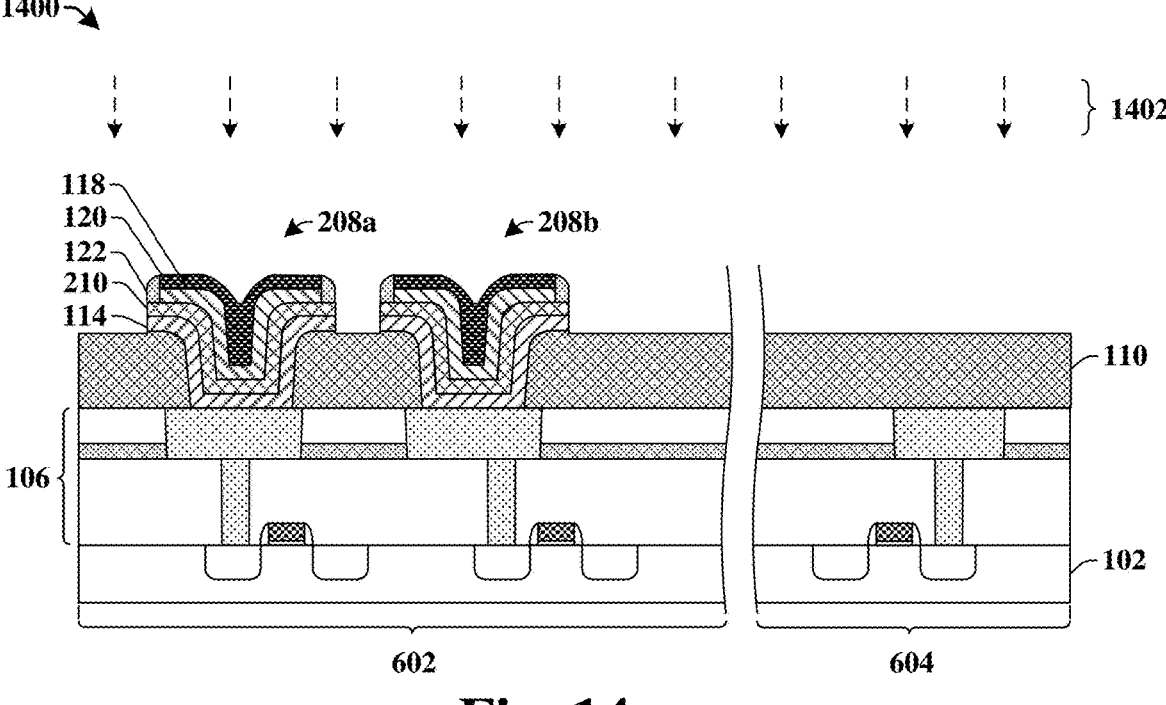

As shown in cross-sectional view 1400 of FIG. 14, a second patterning process is performed to define a first FeRAM device 208a and a second FeRAM device 208b, respectively comprising a ferroelectric material 210 disposed between a bottom electrode 114 and the top electrode 118. The second patterning process selectively exposes the ferroelectric layer (1104 of FIG. 13) and the bottom electrode layers (1102 of FIG. 13) to an etchant 1402 to define the ferroelectric material 210 and the bottom electrode 114. In some embodiments, the second patterning process may further etch the lower insulating structure 110, so as to cause the lower insulating structure 110 to have a smaller thickness laterally outside of the bottom electrode 114 than directly below the bottom electrode 114.

Figure 15:
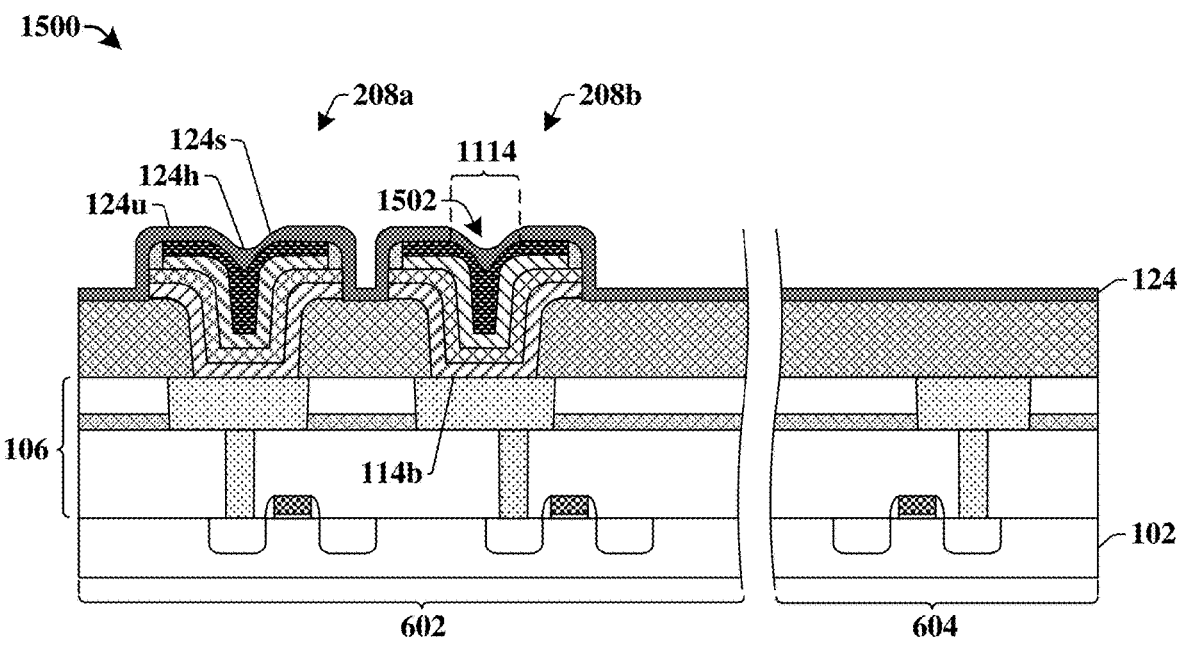

As shown in cross-sectional view 1500 of FIG. 15, a protective layer 124 is formed over the first FeRAM device 208a and the second FeRAM device 208b. The protective layer 124 has sidewalls 124s and a horizontally extending surface 124h that define a fifth recess 1502 that is within an upper surface 124u of the protective layer 124 and that is directly over a bottom surface 114b of the bottom electrode 114. In some embodiments, the protective layer 124 may be formed using a deposition technique (e.g., PVD, CVD, PE-CVD, ALD, sputtering, etc.). In various embodiments, the protective layer 124 may comprise one or more of silicon carbide, Tetraethyl orthosilicate (TEOS), or the like.

Figure 16:
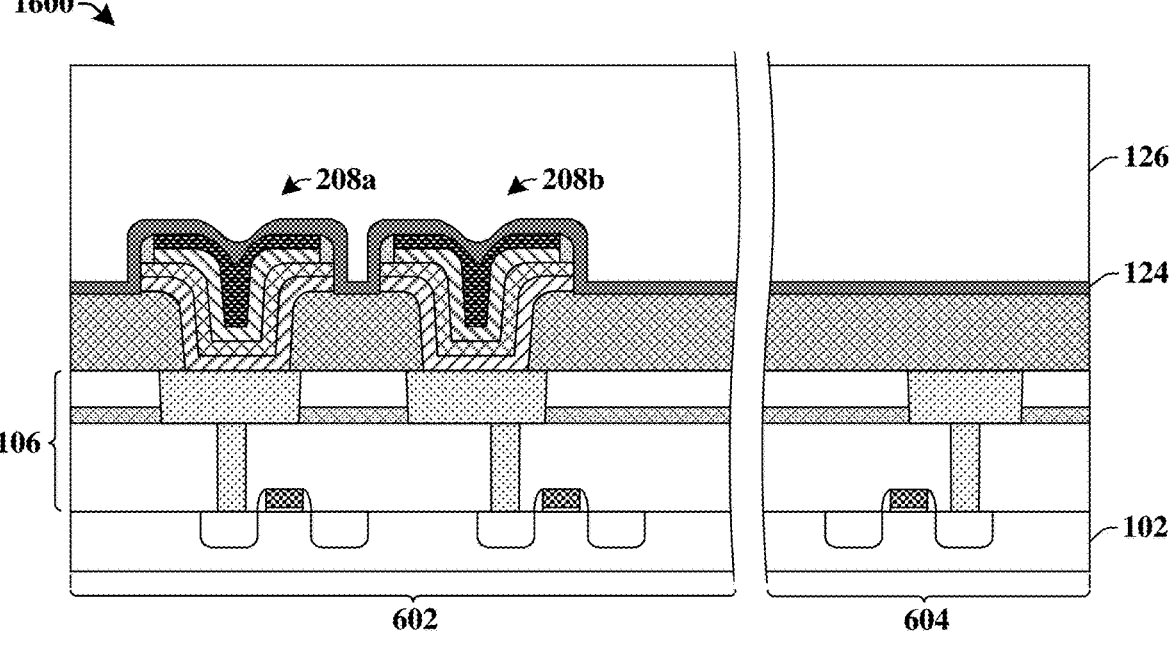

As shown in cross-sectional view 1600 of FIG. 16, an upper dielectric structure 126 is formed over the protective layer 124. The upper dielectric structure 126 is formed to cover the first FeRAM device 208a and the second FeRAM device 208b. In some embodiments, the upper dielectric structure 126 may be formed by a deposition process (e.g., PVD, CVD, PE-CVD, ALD, or the like). In various embodiments, the upper dielectric structure 126 may comprise silicon dioxide, carbon doped silicon dioxide, silicon oxynitride, borosilicate glass (BSG), phosphoric silicate glass (PSG), borophosphosilicate glass (BPSG), fluorinated silicate glass (FSG), a porous dielectric material (e.g., porous carbon doped silicon dioxide), or the like.

Figure 17:
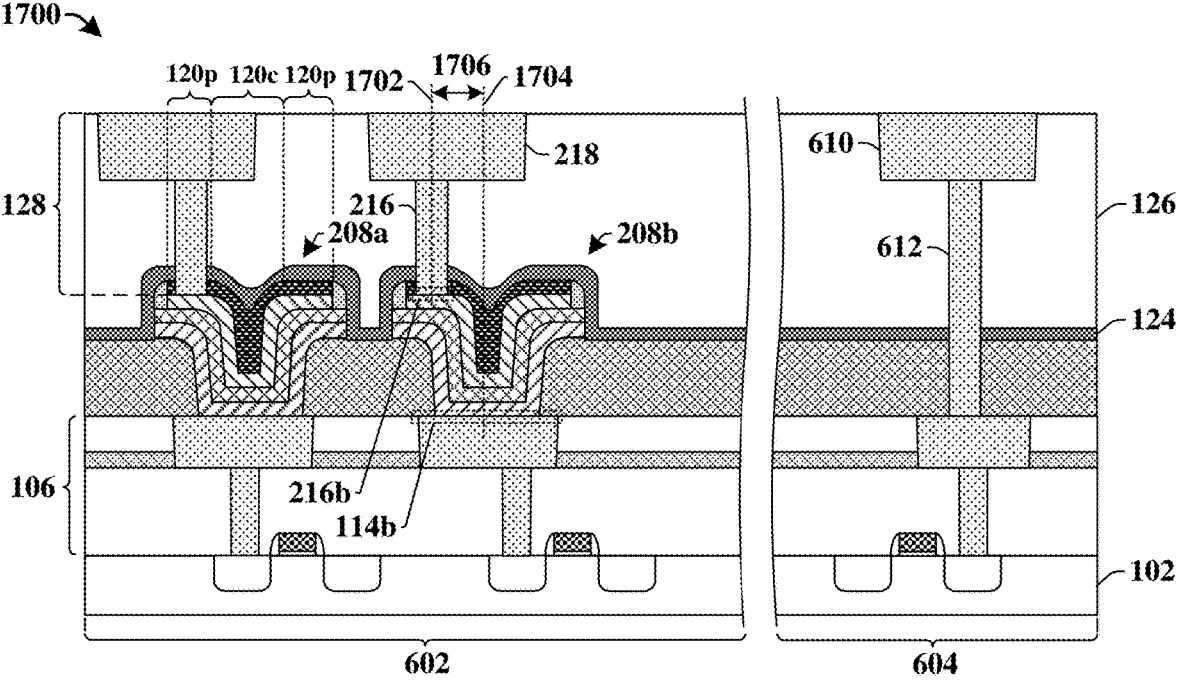

As shown in cross-sectional view 1700 of FIG. 17, an upper interconnect structure 128 is formed in the upper dielectric structure 126 within the embedded memory region 602, and one or more additional interconnect layers 610-612 are formed in the upper dielectric structure 126 within the logic region 604. In some embodiments, the upper interconnect structure 128 may comprise an interconnect via 216 (e.g., a top electrode via (TEVA)) and an interconnect wire 218. In some embodiments, the one or more additional interconnect layers 610-612 may comprise an interconnect via 612 and an interconnect wire 610. The upper interconnect structure 128 and the one or more additional interconnect layers 610-612 may be concurrently formed by selectively etching the upper dielectric structure 126 to define via holes and/or trenches within the upper dielectric structure 126, forming a conductive material (e.g., copper, aluminum, etc.) within the via holes and/or trenches, and performing a planarization process (e.g., a chemical mechanical planarization process). In some embodiments, the planarization process may comprise a chemical mechanical planarization (CMP) process.

In some embodiments, the interconnect via 216 may be formed to extend through the peripheral region 120p of the hard mask 120 to contact an upper surface of the top electrode 118. By having the interconnect via 216 extend through the peripheral region 120p of the hard mask 120, an etching process used to form the interconnect via 216 avoids etching through the different thicknesses of the hard mask 120 within the central region 120c, which could lead to poor etching of a via hole (e.g., which could lead to over etching that may result in a high resistance connection between the interconnect via 216 and the top electrode 118, or which could lead to under etching that may result in an open circuit). Rather, because the hard mask 120 has a substantially constant thickness within the peripheral region 120p, a process window of an etching process used to form the interconnect via 216 may be improved. Improving the process window of the etching process allows for improved integration of high density memory arrays (e.g., high density FeRAM arrays) within an integrated chip. Furthermore, due to the improved process window the etching process may be able to completely remove a part of the hard mask 120 from over the top electrode 118 without damaging the top electrode 118, thereby enabling a good electrical connection to be achieved between the top electrode 118 and the interconnect via 216. In some embodiments, the interconnect via 216 has a bottom surface 216b that is centered upon a first vertically extending line 1702 and that is laterally offset by a first non-zero distance 1706 from a second vertically extending line 1704 that extends through a center of a bottom surface 114b of the bottom electrode 114. In some embodiments, the interconnect via 216 is directly over a substantially flat upper surface of the top electrode 118.

FIG. 18 illustrates a flow diagram of some embodiments of a method 1800 of forming an integrated chip having an FeRAM device without using a planarization process to define a bottom electrode of the FeRAM device.

While method 1800 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1802, an access device is formed within a substrate. FIG. 7 illustrates a cross-sectional view 700 of some embodiments corresponding to act 1802.

At 1804, a plurality of lower interconnect layers are formed within a lower dielectric structure over the substrate. FIG. 8 illustrates a cross-sectional view 800 of some embodiments corresponding to act 1804.

At 1806, a lower insulating structure is formed over the lower dielectric structure. The lower insulating structure is formed to have openings overlying an interconnect structure of the plurality of lower interconnect layers. FIGS. 9-10 illustrates cross-sectional views 900-1000 of some embodiments corresponding to act 1806.

At 1808, a bottom electrode layer, a ferroelectric layer, a top electrode layer, and a hard mask layer are sequentially formed over the lower insulating structure. FIGS. 11A-11D illustrates cross-sectional views 1100A-1100D of some embodiments corresponding to act 1808.

At 1810, a first patterning process is performed on the top electrode layer and the hard mask layer to define a top electrode and a hard mask. FIG. 12 illustrates a cross-sectional view 1200 of some embodiments corresponding to act 1810.

At 1812, sidewall spacers are formed along sidewalls of top electrode and hard mask. FIG. 13 illustrates a cross-sectional view 1300 of some embodiments corresponding to act 1812.

At 1814, a second patterning process is performed on the ferroelectric layer and the bottom electrode layer to define a first FeRAM device and a second FeRAM device, respectively having a ferroelectric material disposed between a bottom electrode and the top electrode. FIG. 14 illustrates a cross-sectional view 1400 of some embodiments corresponding to act 1814.

At 1816, a protective layer is formed over the first FeRAM device and the second FeRAM device. FIG. 15 illustrates a cross-sectional view 1500 of some embodiments corresponding to act 1816.

At 1818, an upper interconnect structure is formed within an upper dielectric structure disposed over the protective layer. FIGS. 16-17 illustrate cross-sectional views 1600-1700 of some alternative embodiments corresponding to act 1818.

Figure 19A:
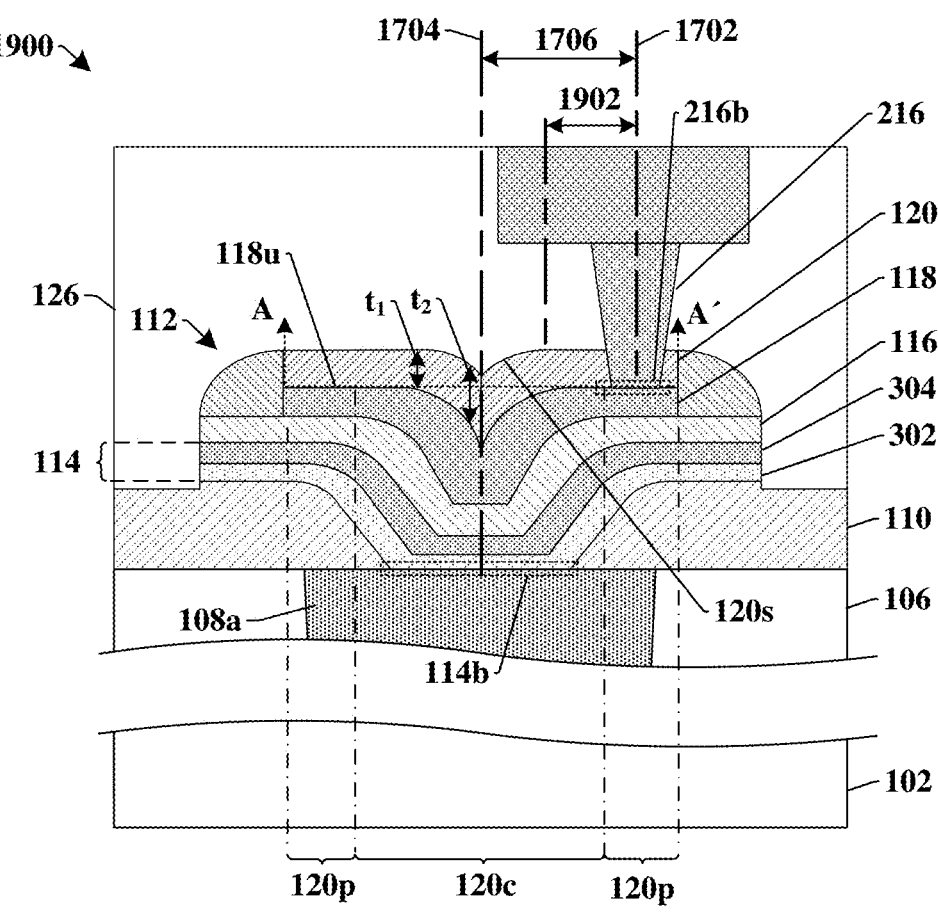
FIGS. 19A-19B illustrates some additional embodiments of an integrated chip having a memory device including a top electrode and a bottom electrode having a bottom surface that is off-centered from a bottom surface of an interconnect via contacting the top electrode.

FIG. 19A illustrates a cross-sectional view of some additional embodiments of an integrated chip 1900 having a memory device including a top electrode and a bottom electrode having a bottom surface that is off-centered from a bottom surface of an interconnect via contacting the top electrode.

The integrated chip 1900 comprises a memory device 112 (e.g., an FeRAM device) disposed over a lower insulating structure 110 over a substrate 102. The memory device 112 comprises a data storage structure 116 arranged between a bottom electrode 114 and a top electrode 118. In some embodiments, the bottom electrode 114 may contact an interconnect structure 108a that is disposed within a lower dielectric structure 106 below the lower insulating structure 110. In some embodiments, the bottom electrode 114 comprises a liner 302 and a conductive layer 304 disposed over the liner 302. The liner 302 extends along sidewalls and an upper surface of the lower insulating structure 110. The liner 302 may be configured to act as a diffusion barrier and/or a glue layer.

The bottom electrode 114, the data storage structure 116, and the top electrode 118 are conformally disposed over the lower insulating structure 110 so as to give respective ones of the bottom electrode 114, the data storage structure 116, and the top electrode 118 an uneven top surface (e.g., a top surface with a concave profile in a central region). For example, the bottom electrode 114 has one or more first interior sidewalls that are coupled to a first horizontally extending surface to define a first recess within an upper surface of the bottom electrode 114. The data storage structure 116 is disposed within the first recess and comprises one more second interior sidewalls that are coupled to a second horizontally extending surface to define a second recess within an upper surface of the data storage structure 116 and directly over the first recess. The top electrode 118 is disposed within the second recess and comprises one or more third interior sidewalls that meet at a point overlying the second recess to define a third recess within an upper surface 118u of the top electrode 118. In some embodiments, the one or more third interior sidewalls may comprise curved sidewalls. In some embodiments, the upper surface 118u of the top electrode 118 is a substantially flat surface.

A hard mask 120 is disposed over the top electrode 118. The hard mask 120 continuously extends from over the upper surface 118u of the top electrode 118 to directly between the third interior sidewalls of the top electrode 118, so that the hard mask 120 is disposed within the third recess. In some embodiments, the hard mask 120 comprises one or more interior sidewalls 120s that meet at a point overlying the third recess, so as to define a fourth recess within an upper surface of the hard mask 120. In some embodiments, the one or more interior sidewalls 120s may comprise curved sidewalls. The hard mask 120 has a central region 120c that overlies the third recess within the top electrode 118 and a peripheral region 120p that surrounds the central region 120c. In some embodiments, the hard mask 120 may have a thickness that varies within the central region 120c of the hard mask 120. The variations in thickness within the central region 120c cause the hard mask 120 to have different thicknesses at different lateral positions within the central region 120c. For example, the hard mask 120 may have a first thickness $t_1$ at a first position and a second thickness $t_2$, which is different than the first thickness $t_1$, at a second position. In some embodiments, a thickness of the hard mask 120 varies over a first range of vertical distances within the central region 120c and the thickness of the hard mask 120 varies over a second range of vertical distances, which is smaller than the first range, within the peripheral region 120p.

An interconnect via 216 (e.g., an upper electrode via or a top electrode via (TEVA)) is disposed within an upper dielectric structure 126 (e.g., an upper ILD layer) that is over the memory device 112 and the lower insulating structure 110. The interconnect via 216 extends through the hard mask 120 to contact the top electrode 118. A bottom surface 216b of the interconnect via 216 is centered upon a first vertically extending line 1702 that is laterally offset by a first non-zero distance 1706 from a second vertically extending line 1704 centered upon a bottom surface 114b of the bottom electrode 114. By having the first vertically extending line 1702 laterally offset from the second vertically extending line 1704, the interconnect via 216 may be offset from the third recess. In some embodiments, the interconnect via 216 may have a bottom surface 216b that is laterally separated from the one or more interior sidewalls 120s of the hard mask 120 by a second non-zero distance 1902.

Figure 19B:
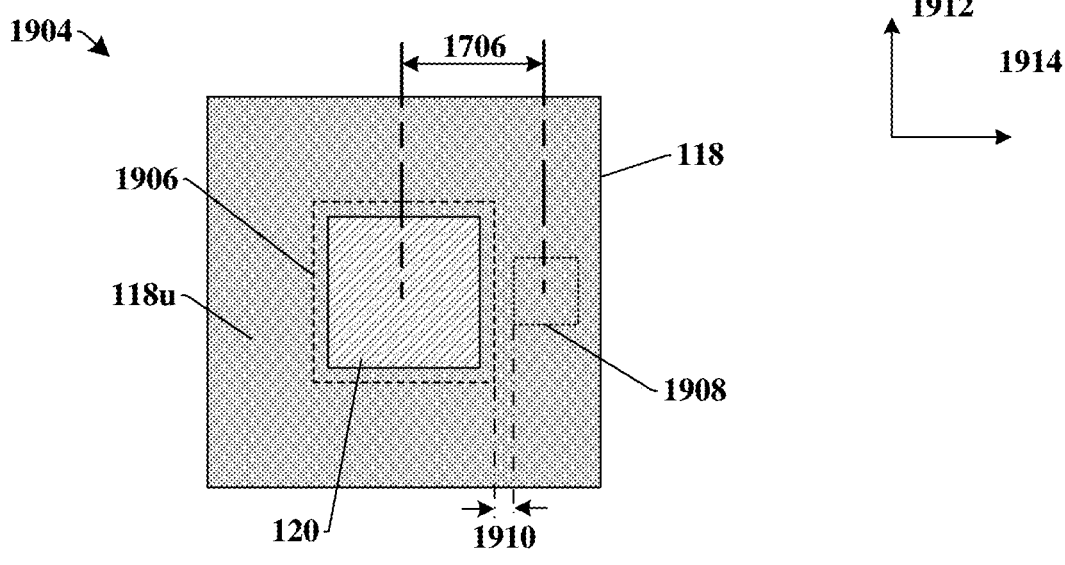

As shown in top-view 1904 of FIG. 19, in some embodiments a projection 1906 (e.g., a boundary) of a bottom surface (114b of FIG. 19A) of the bottom electrode (114 of FIG. 19A) may be completely laterally outside of a projection 1908 (e.g., a boundary) of a bottom surface (216b of FIG. 19A) of the interconnect via (216 of FIG. 19A). In some embodiments, the projection 1906 of the bottom surface of the bottom electrode may extend laterally past the projection 1908 of the bottom surface of the interconnect via along a first direction 1912. In some additional embodiments, the projection 1906 of the bottom surface of the bottom electrode may be laterally separated from the projection 1908 of the bottom surface of the interconnect via by a third non-zero distance 1910 along a second direction 1914 that is perpendicular to the first direction 1912.

By contacting the upper surface 118u of the top electrode 118 at a lateral position that is outside of the bottom surface 114b of the bottom electrode 114, the interconnect via 216 is able to land on a relatively flat region of the top electrode 118. Landing on the relatively flat region of the top electrode 118 avoids having to etch through the different thicknesses of the hard mask 120 during fabrication of the interconnect via 216. By avoiding having to etch through the different thickness of the hard mask 120 during fabrication of the interconnect via 216, etch non-uniformities can be avoided resulting in a relatively low probability of poor contact between the top electrode 118 and the interconnect via 216 and preventing an open circuit or a relatively low contact resistance between the interconnect via 216 and the top electrode 118.

Figure 20A:
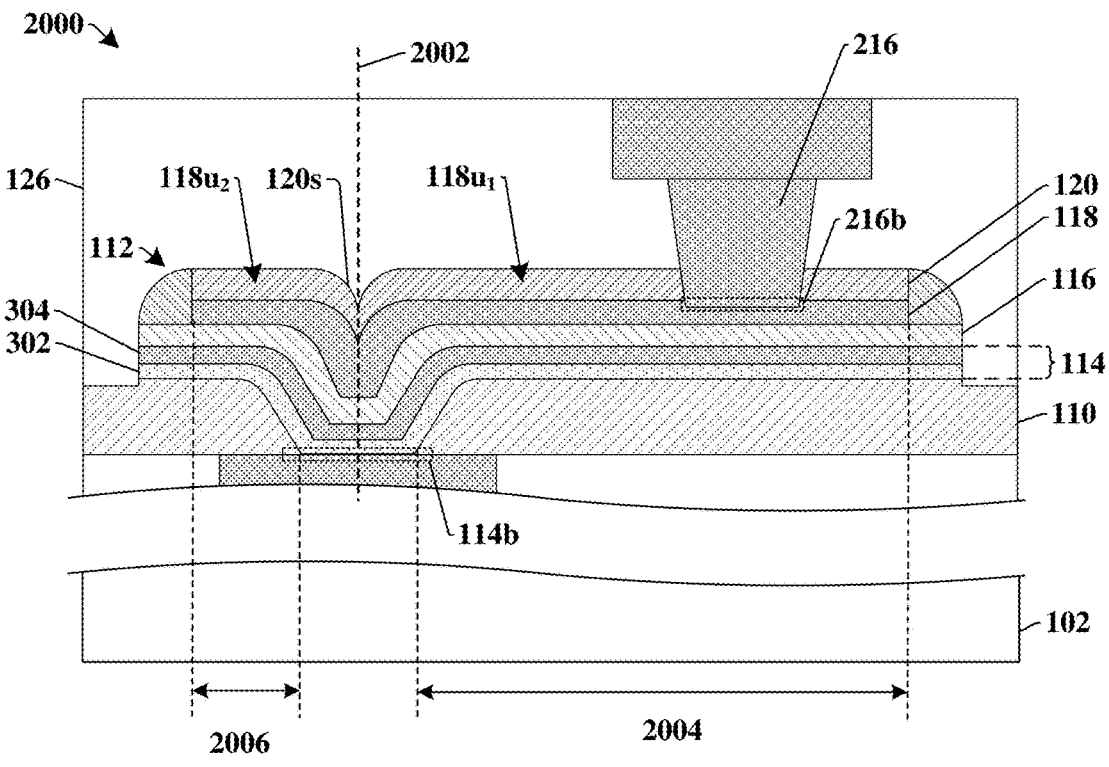
FIGS. 20A-20B illustrate some additional embodiments of an integrated chip having a memory device including a top electrode and a bottom electrode having a bottom surface that is off-centered from a bottom surface of an interconnect via contacting the top electrode.

FIG. 20A illustrates a cross-sectional view of some additional embodiments of an integrated chip 2000 having a memory device including a top electrode and a bottom electrode having a bottom surface that is off-centered from a bottom surface of an interconnect via contacting the top electrode.

The integrated chip 2000 comprises a memory device 112 disposed over a lower insulating structure 110 over a substrate 102. The memory device 112 comprises a data storage structure 116 arranged between a bottom electrode 114 and a top electrode 118. In some embodiments, a hard mask 120 is disposed over the top electrode 118. The hard mask 120 may comprise one or more interior sidewalls 120s that form a recess within an upper surface of the hard mask 120. In some embodiments, the one or more interior sidewalls 120s are curved and meet at a point that is directly over a bottom surface 114b of the bottom electrode 114.

In some embodiments, the memory device 112 may be asymmetric about a vertically extending line 2002 bisecting the bottom surface 114b of the bottom electrode 114. For example, in some embodiments, the memory device 112 may extend to a first distance 2004 past a first edge of the bottom surface 114b and to a second distance 2006 past an opposing second edge of the bottom surface 114b. In such embodiments, the top electrode 118 may comprise a first upper surface $118u_1$ and a second upper surface $118u_2$, as viewed along the cross-sectional view of FIG. 20A. The first upper surface $118u_1$ may have a first width that is larger than a second width of the second upper surface $118u_2$.

In some embodiments, an interconnect via 216 may be disposed within an upper dielectric structure 126 (e.g., an upper ILD layer) over the memory device 112. The interconnect via 216 may contact the first upper surface $118u_1$. By having the interconnect via 216 contact the first upper surface $118u_1$, the chances of the interconnect via 216 extending through a region of the hard mask 120 having a uniform thickness are improved. In some embodiments, a bottom surface 216b of the interconnect via 216 is laterally separated from the one or more interior sidewalls 120s of the hard mask 120 by a non-zero distance.

In some embodiments, the bottom electrode 114 and/or the top electrode 118 may comprise one or more of titanium, titanium nitride, tantalum, tantalum nitride, tungsten, platinum, ruthenium, iridium, molybdenum, or the like. In some embodiments, the bottom electrode 114 and the top electrode 118 may comprise or be a same material. In some embodiments, the bottom electrode 114 and the top electrode 118 may comprise or be different materials. In some embodiments, the bottom electrode 114 may comprise a liner 302 and a conductive layer 304 over the liner 302. In some such embodiments, the liner 302 may comprise titanium nitride, tantalum nitride, or the like, and the conductive layer 304 may comprise titanium, tantalum, or the like.

In some embodiments, the data storage structure 116 may comprise a ferroelectric material. In some such embodiments, the data storage structure 116 may comprise binary oxide, such as hafnium oxide (e.g., $HfO_2$). In other such embodiments, the data storage structure 116 may comprise a ternary oxide, such as hafnium silicate (e.g., $HfSiO_x$), hafnium zirconate (e.g., $HfZrO_x$), barium titanate (e.g., $BaTiO_3$), lead titanate (e.g., $PbTiO_3$), strontium titanate (e.g., $SrTiO_3$), aluminum scandium nitride (e.g., AlScN), aluminum gallium nitride (e.g., AlGaN), aluminum yttrium nitride (e.g., AlYN), doped hafnium oxide (e.g., comprising a dopant of silicon, zirconium, yttrium, aluminum, gadolinium, strontium, lanthanum, scandium, germanium, or the like). In yet other such embodiments, the data storage structure 116 may comprise a quaternary oxide, such as lead zirconate titanate (e.g., PZT, $PbZr_xTi_yO_z$), barium strontium titanate (e.g., $BaSrTiO_x$), strontium bismuth tantalite (e.g., SBT, $SrBi_2Ta_2O_e$), or the like.

Figure 20B:
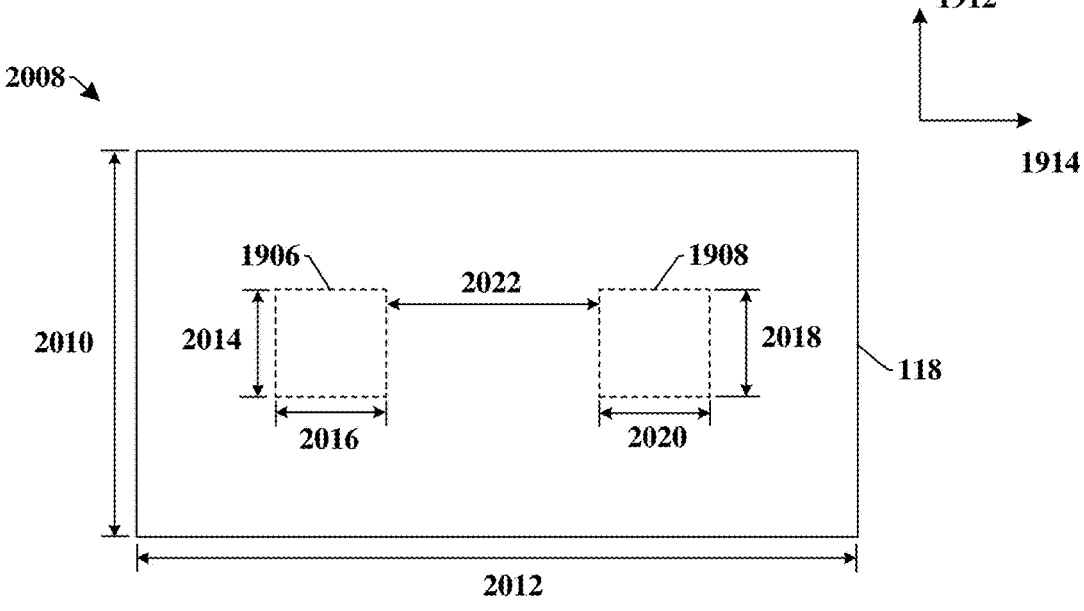

FIG. 20B illustrates a top-view 2008 of some embodiments corresponding to the integrated chip of FIG. 20A.

As shown in top-view 2008 of FIG. 20B, in some embodiments the boundary of the top electrode 118 may comprise a rectangular shape having a first width 2010 extending along a first direction 1912 and a second width 2012 extending along the second direction 1914 that is perpendicular to the first direction 1912. The second width 2012 is larger than the first width 2010.

A projection 1906 of the bottom surface of the bottom electrode and a projection 1908 of the bottom surface of the interconnect via are both disposed over the boundary of the top electrode 118. In some embodiments, the projection 1906 of the bottom surface of the bottom electrode has a third width 2014 along the first direction 1912 and a fourth width 2016 along the second direction 1914. In some embodiments, the third width 2014 and the fourth width 2016 may be substantially equal. In some embodiments, the projection 1908 of the bottom surface of the interconnect via has a fifth width 2018 along the first direction 1912 and a sixth width 2020 along the second direction 1914. In some embodiments, the fifth width 2018 and the sixth width 2020 may be substantially equal.

In some embodiments, the projection 1906 of the bottom surface of the bottom electrode may be separated from the projection 1908 of the bottom surface of the interconnect via by a distance 2022 measured along the second direction 1914. In some embodiments, the distance 2022 may be larger than the fourth width 2016 and/or the sixth width 2020.

Figure 21:
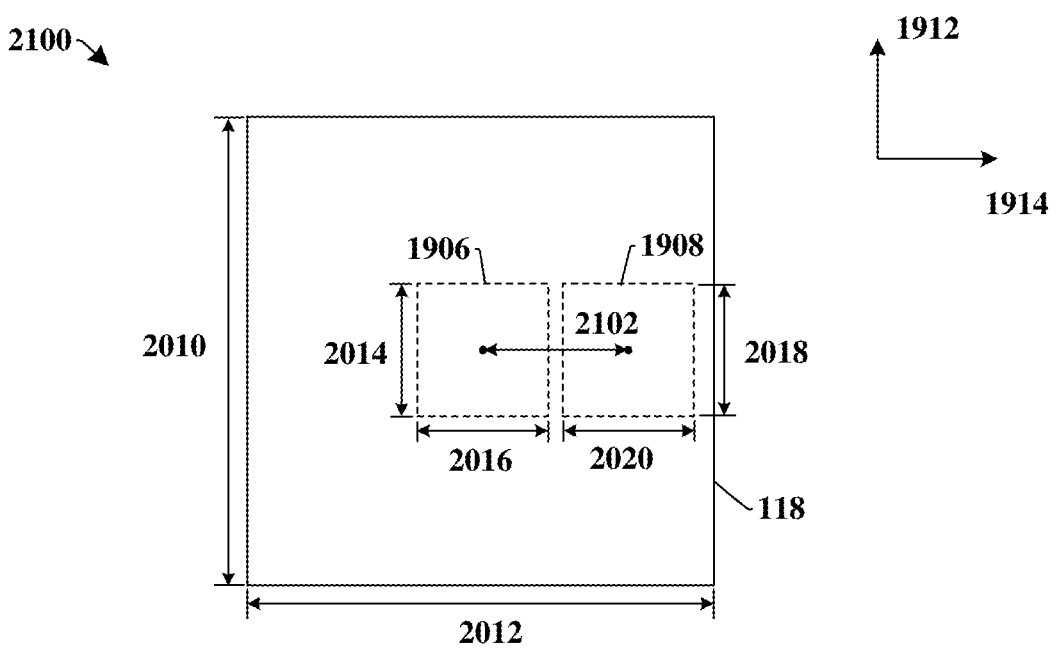
FIG. 21 illustrates a top-view of some additional embodiments of integrated chips having a memory device including a top electrode and a bottom electrode having a bottom surface that is off-centered from a bottom surface of an interconnect via contacting the top electrode.

FIG. 21 illustrates a top-view 2100 of some additional embodiments of an integrated chip having a memory device including a top electrode and a bottom electrode having a bottom surface that is off-centered from a bottom surface of an interconnect via contacting the top electrode.

As shown in top-view 2100 of FIG. 21, in some embodiments a boundary of a top electrode 118 may have a first width 2010 extending along a first direction 1912 and a second width 2012 extending along a second direction 1914. In some embodiments, the first width 2010 may be in a range of between approximately 10 nanometers (nm) and approximately 10000 nm, between approximately 100 nm and approximately 5000 nm, or other similar values. In some embodiments, the second width 2012 may be in a range of between approximately 10 nm and approximately 10000 nm, between approximately 100 nm and approximately 5000 nm, or other similar values. In some embodiments, the first width 2010 and the second width 2012 may be substantially equal, so that the boundary of a top electrode 118 may be a substantially square shape.

A projection 1906 of the bottom surface of a bottom electrode and a projection 1908 of the bottom surface of the interconnect via are both disposed within the boundary of the top electrode 118. In some embodiments, the projection 1906 of the bottom surface of the bottom electrode has a third width 2014 along the first direction 1912 and a fourth width 2016 along the second direction 1914. In some embodiments, the projection 1906 of the bottom surface of the interconnect via has a fifth width 2018 along the first direction 1912 and a sixth width 2020 along the second direction 1914. In some embodiments, the third width 2014, the fourth width 2016, the fifth width 2018, and the sixth width 2020 may respectively be in a range of between approximately 10 nm and approximately 1000 nm, between approximately 100 nm and approximately 500 nm, or other similar values. In some embodiments, the third width 2014 and the fourth width 2016 may be substantially equal. In some embodiments, the fifth width 2018 and the sixth width 2020 may be substantially equal.

In some embodiments, a center (e.g., a geometric center) of the projection 1906 of the bottom surface of the bottom electrode and a center (e.g., a geometric center) of the projection 1908 of the bottom surface of the interconnect via may be separated from one another by a distance 2102. In some embodiments, the distance may be larger than the fourth width 2016 and/or the sixth width 2020. In some embodiments, the distance 2102 may be in a range of between approximately 1 nm and approximately 1000 nm, between approximately 10 nm and approximately 500 nm, or other similar values.

It will be appreciated that in various embodiments, the projection 1906 of the bottom surface of the bottom electrode, the boundary of the top electrode 118, and the projection 1908 of the bottom surface of the interconnect via may have various geometries, sizes, and/or positions. The various geometries, sizes, and or positions allow for different operating parameters and design considerations to be achieved. FIGS. 22A-22G illustrate top-views of some additional embodiments of integrated chips having a memory device including a top electrode and a bottom electrode having a bottom surface that is off-centered from a bottom surface of an interconnect via contacting the top electrode.

Figure 22A:
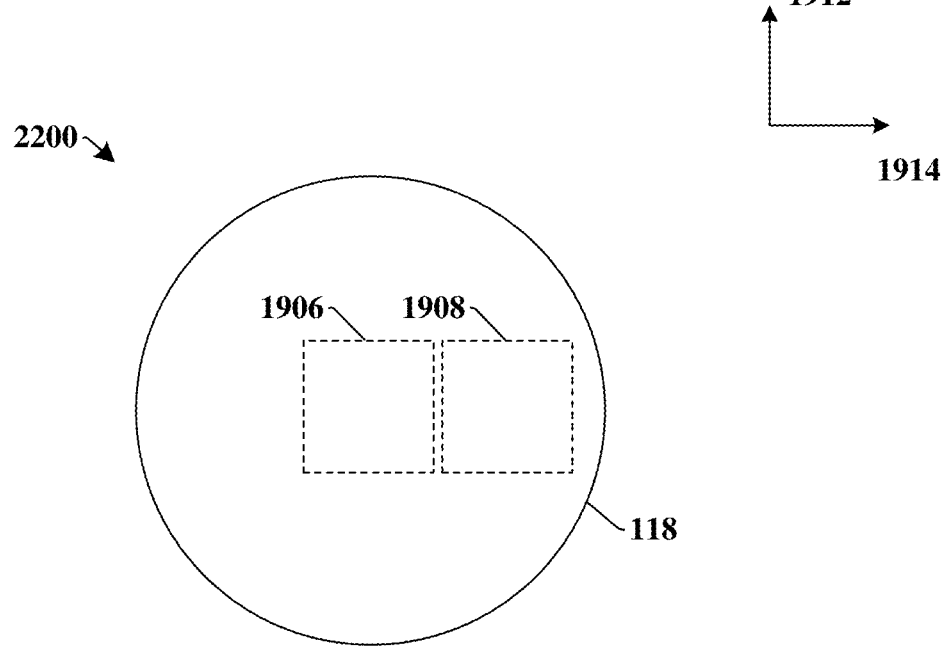
FIGS. 22A-22G illustrate top-views of some additional embodiments of integrated chips having a memory device including a top electrode and a bottom electrode having a bottom surface that is off-centered from a bottom surface of an interconnect via contacting the top electrode.

As shown in top-view 2200 of FIG. 22A, in some embodiments the boundary of the top electrode 118 may have a rounded shape (e.g., a substantially circular shape, a substantially oval shape, etc.). The rounded shape has one or more rounded outer sidewalls that define the boundary of the top electrode 118. In some embodiments, the projection 1906 of the bottom surface of the bottom electrode and the projection 1908 of the bottom surface of the interconnect via may have different shapes than the boundary of the top electrode 118. For example, the projection 1906 of the bottom surface of the bottom electrode and the projection 1908 of the bottom surface of the interconnect via may have substantially square shapes.

Figure 22B:
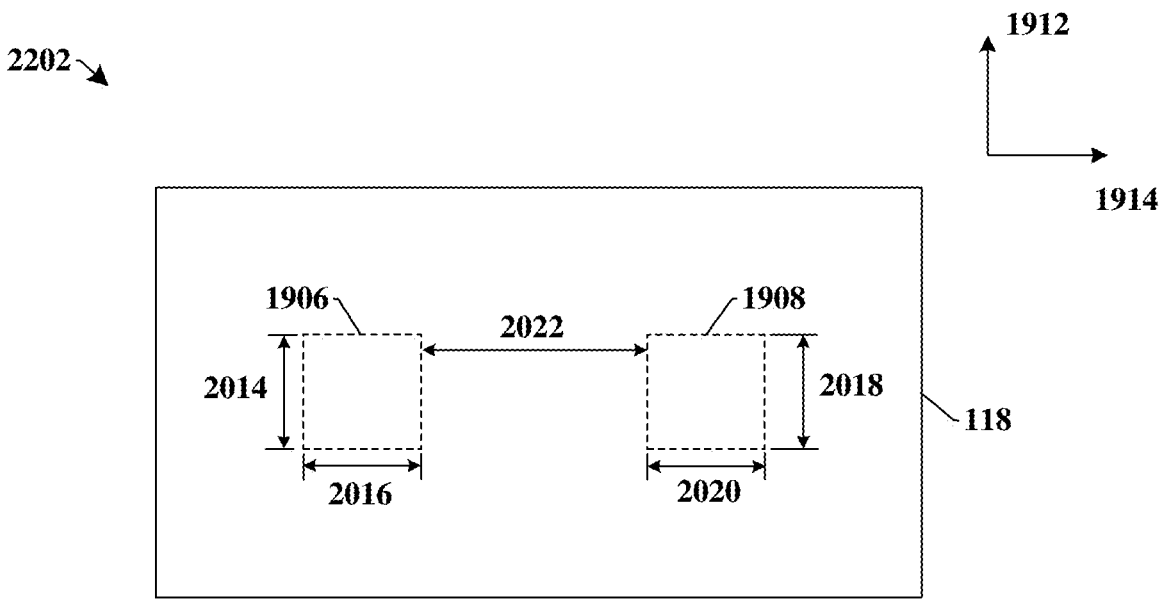

As shown in top-view 2202 of FIG. 22B, in some embodiments the projection 1906 the bottom surface of the bottom electrode may be separated from the projection 1908 of the bottom surface of the interconnect via by a distance 2022 that is greater than a fourth width 2016 of the projection 1906 of the bottom surface of the bottom electrode and/or a sixth width 2020 of the projection 1908 of the bottom surface of the interconnect via. In some embodiments, the distance 2022 may be greater than approximately 1 nm, greater than approximately 10 nm, greater than approximately 100 nm, greater than approximately 1000 nm or other similar values.

Figure 22C:
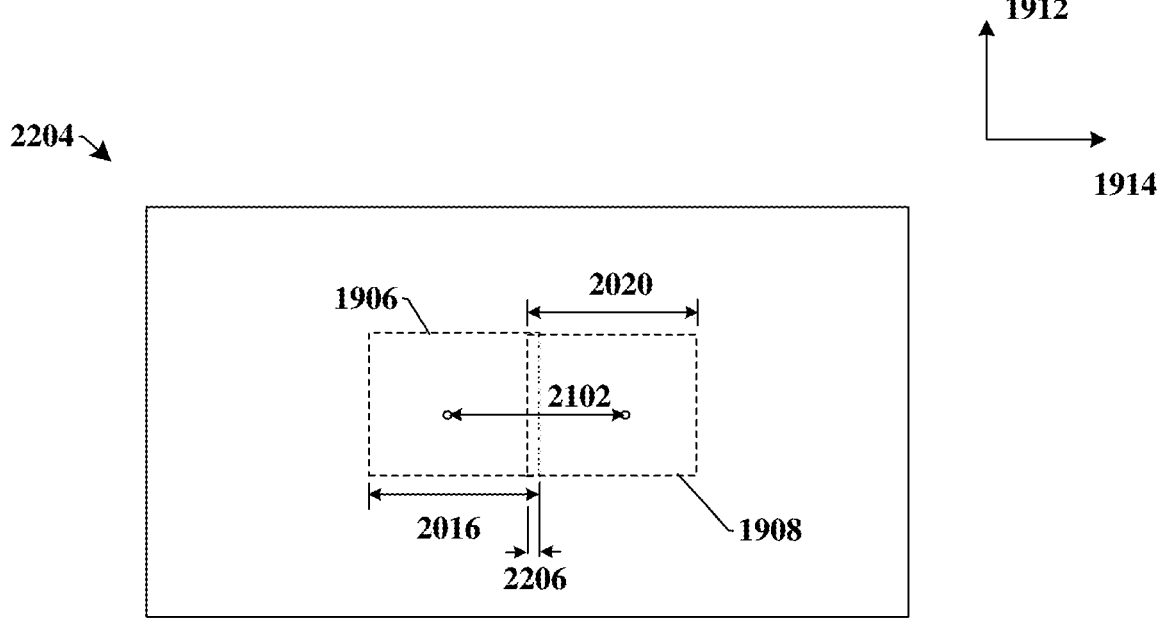

As shown in top-view 2204 of FIG. 22C, in some embodiments, the projection 1906 of the bottom surface of the bottom electrode may laterally overlap a part, but not all, of the projection 1908 of the bottom surface of the interconnect via over a non-zero distance 2206. The projection 1906 of the bottom surface of the bottom electrode laterally extends past an outermost boundary of the projection 1908 of the bottom surface of the interconnect via so that the projection 1908 of the bottom surface of the interconnect via does not completely overlap the projection 1906 of the bottom surface of the bottom electrode. Having an overlap between the projections may allow for a size of a memory device to be reduced. In some such embodiments, a center of the projection 1906 of the bottom surface of the bottom electrode is separated from a center of the projection 1908 of the bottom surface of the interconnect via by a distance 2102 that is smaller than a fourth width 2016 of the projection 1906 of the bottom surface of the bottom electrode and/or a sixth width 2020 of the projection 1908 of the bottom surface of the top electrode.

Figure 22D:
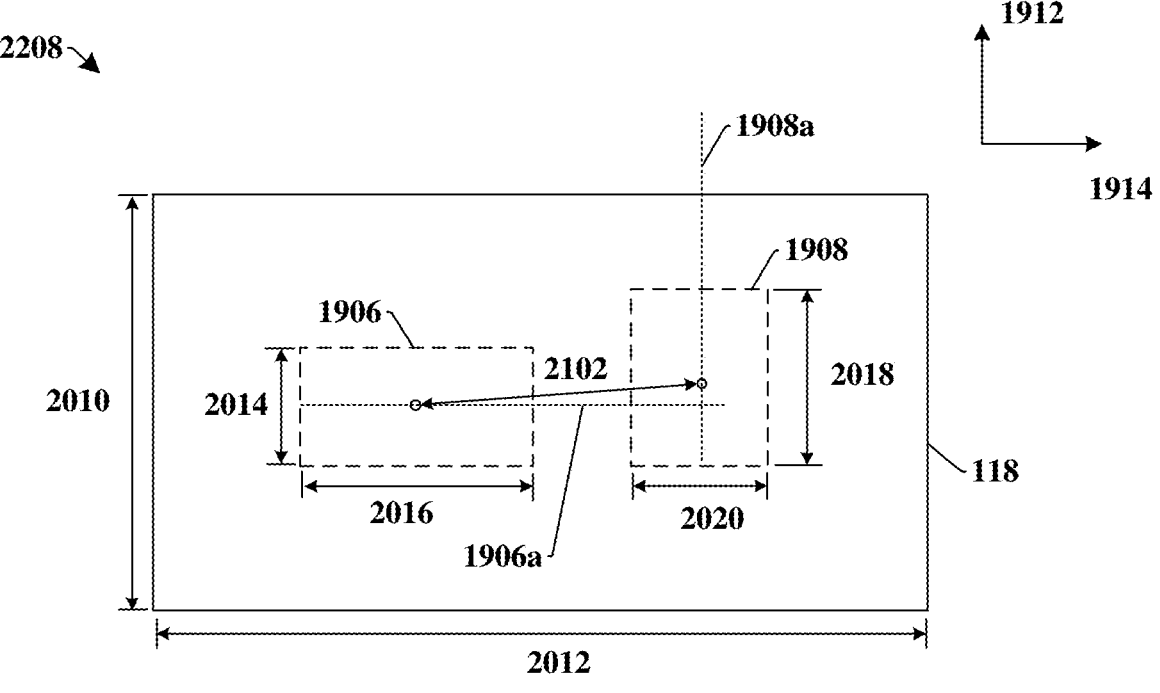

As shown in top-view 2208 of FIG. 22D, in some embodiments the boundary of the top electrode 118 may comprise a rectangular shape having a first width 2010 and a second width 2012 that is larger than the first width 2010. In some embodiments, the projection 1906 of the bottom surface of the bottom electrode may comprise a rectangular shape having a third width 2014 and a fourth width 2016 that is larger than the third width 2014. In some embodiments, the projection 1908 of the bottom surface of the interconnect via may comprise a rectangular shape having a fifth width 2018 and a sixth width 2020 that is smaller than the fifth width 2018. By having the projection 1908 of the bottom surface of the interconnect via extend along a long axis 1908a that does not intersect the projection 1906 of the bottom surface of the bottom electrode, a second width 2012 of the top electrode 118 may be reduced while allowing the projections to remain laterally offset from one another. Furthermore, having the projection 1908 of the bottom surface of the interconnect via extend along a long axis 1908a that intersects a long axis 1906a extending along the projection 1906 of the bottom surface of the bottom electrode may reduce negative electric effects caused by critical dimension (CD) errors in a patterning process used to form the top electrode 118.

In some embodiments, a center of the projection 1906 of the bottom surface of the bottom electrode may be separated from a center of the projection 1908 of the bottom surface of the interconnect via by a distance 2102 extending along both the first direction 1912 and the second direction 1914. In some embodiments, the distance 2102 may extend for a greater length along the second direction 1914 than along the first direction 1912. In some embodiments, the projection 1908 of the bottom surface of the interconnect via may extend past one or more outer edges of the projection 1906 of the bottom surface of the bottom electrode as viewed in the top-view 2208.

Figure 22E:
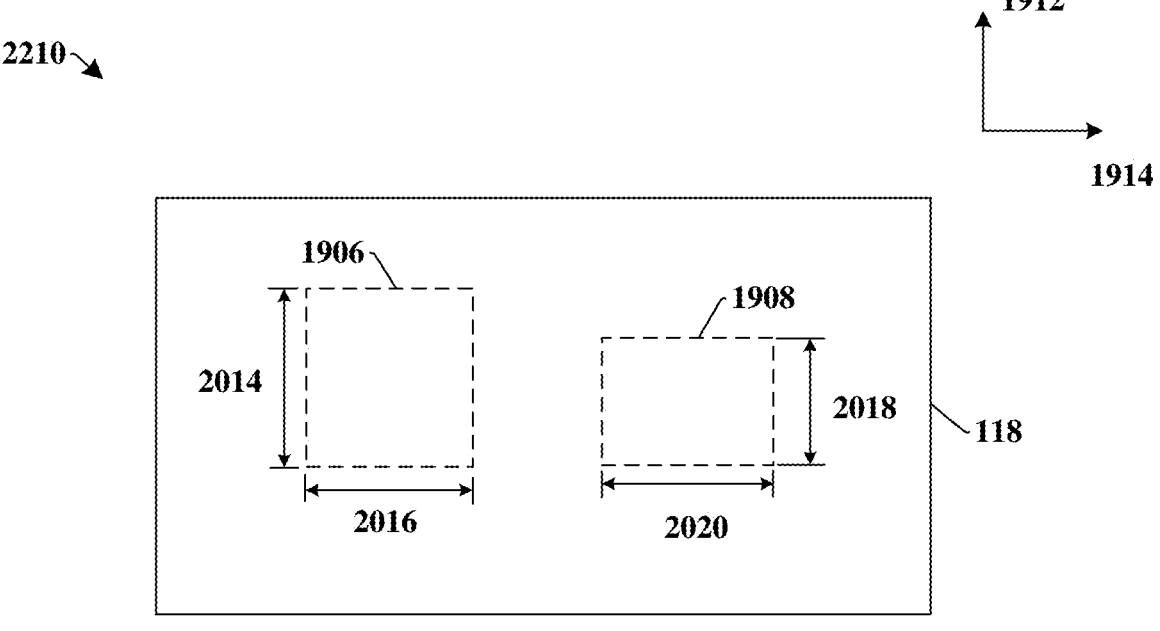

As shown in top-view 2210 of FIG. 22E, in some embodiments the projection 1906 of the bottom surface of the bottom electrode may comprise a substantially square shape having a third width 2014 and a fourth width 2016 that is substantially equal to the third width 2014. In some embodiments, the projection 1908 of the bottom surface of the interconnect via may comprise a rectangular shape having a fifth width 2018 and a sixth width 2020 that is larger than the fifth width 2018. In some embodiments, the projection 1906 of the bottom surface of the bottom electrode may extend past one or more outer edges of the projection 1908 of the bottom surface of the interconnect via, as viewed in the top-view 2210.

Figure 22F:
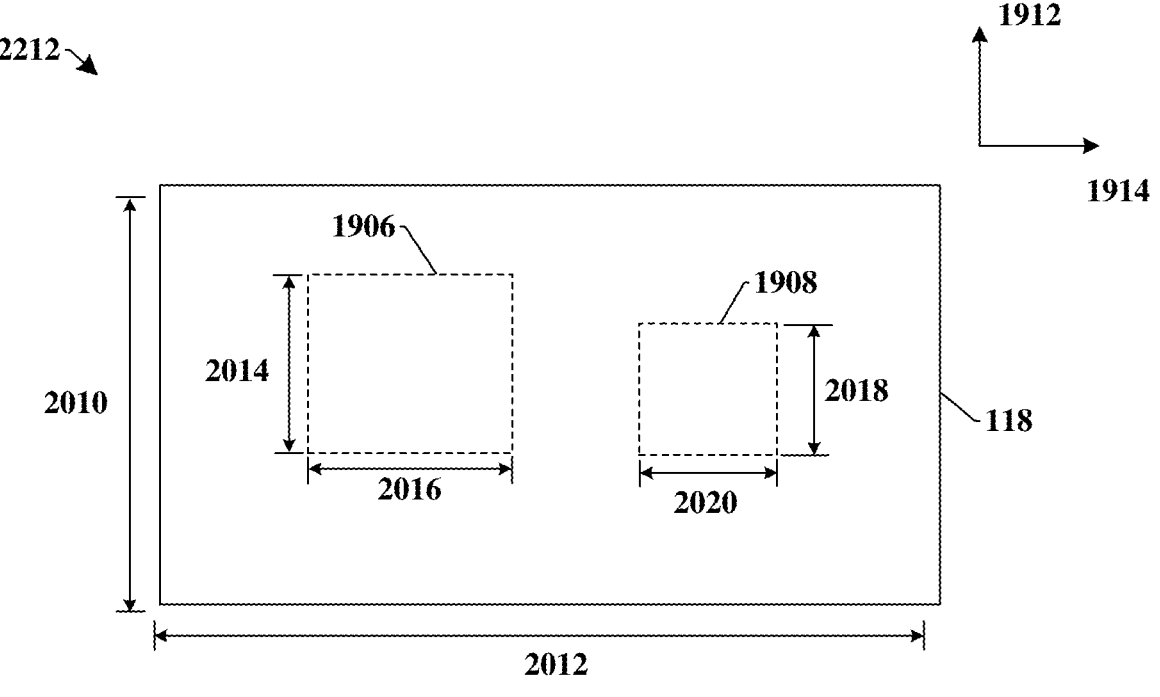

As shown in top-view 2212 of FIG. 22F, in some embodiments the boundary of the top electrode 118 may comprise a rectangular shape having a first width 2010 and a second width 2012 that is larger than the first width 2010. In some embodiments, the projection 1906 of the bottom surface of the bottom electrode may comprise a substantially square shape having a third width 2014 and a fourth width 2016 that is approximately equal to the third width 2014. In some embodiments, the projection 1908 of the bottom surface of the interconnect via may comprise a substantially square shape having a fifth width 2018 and a sixth width 2020 that is substantially equal to the fifth width 2018. In some embodiments, the third width 2014 may be larger than the fifth width 2018.

Figure 22G:
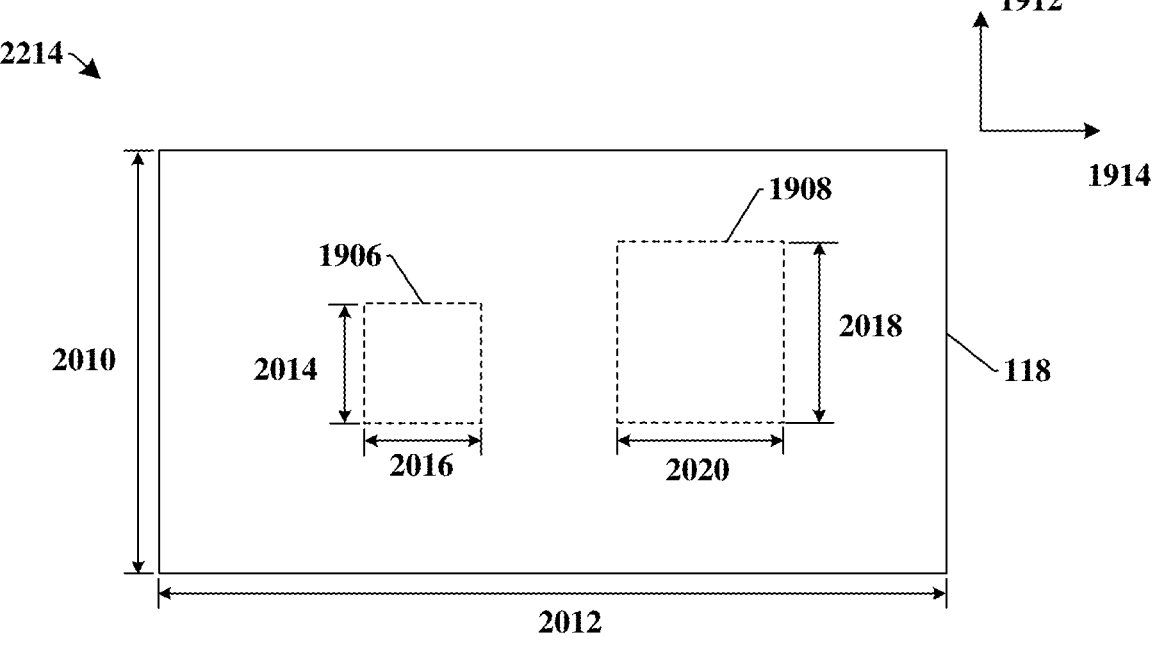

As shown in top-view 2214 of FIG. 22G, in some embodiments the boundary of the top electrode 118 may comprise a rectangular shape having a first width 2010 and a second width 2012 that is larger than the first width 2010. In some embodiments, the projection 1906 of the bottom surface of the bottom electrode may comprise a substantially square shape having a third width 2014 and a fourth width 2016 that is approximately equal to the third width 2014. In some embodiments, the projection 1908 of the bottom surface of the interconnect via may comprise a substantially square shape having a fifth width 2018 and a sixth width 2020 that is substantially equal to the fifth width 2018. In some embodiments, the third width 2014 may be smaller than the fifth width 2018.

FIGS. 23A-23D illustrate top-views of some additional embodiments of integrated chips having a memory device including a top electrode and a bottom electrode having a bottom surface that is off-centered from a bottom surface of an interconnect via contacting the top electrode. As shown in top-views of FIGS. 23A-23D, the bottom surfaces of the bottom electrode and the interconnect via may have different shapes. In some embodiments, it may be advantageous to form the bottom surface of the bottom electrode to have a different shape than the bottom surface of the interconnect via (e.g., because the bottom electrode is formed using a different etching process that has a different depth of focus, because of critical dimension (CD) errors, or the like).

As shown in top-view 2300 of FIG. 23A, in some embodiments the projection 1906 of the bottom surface of the bottom electrode may comprise a substantially square shape and the projection 1908 of the bottom surface of the interconnect via may comprise a substantially circular shape.

As shown in top-view 2302 of FIG. 23B, in some embodiments the projection 1906 of the bottom surface of the bottom electrode and the projection 1908 of the bottom surface of the interconnect via may comprise substantially circular shapes.

As shown in top-view 2304 of FIG. 23C, in some embodiments the projection 1906 of the bottom surface of the bottom electrode may comprise a substantially square shape and the projection 1908 of the bottom surface of the interconnect via may comprise a polygonal shape that extends along two or more sides of the projection 1906 of bottom surface of the bottom electrode.

As shown in top-view 2306 of FIG. 23D, in some embodiments the projection 1906 of the bottom surface of the bottom electrode may comprise a substantially circular shape and the projection 1908 of bottom surface of the interconnect via may comprise a substantially square shape.

Accordingly, in some embodiments, the present disclosure relates to a memory device having a bottom electrode and a top electrode that were not formed using a planarization process (e.g., a CMP process). The bottom electrode of the memory device has a bottom surface that is laterally offset from a bottom surface of an overlying interconnect via contacting the top electrode of the memory device. Having the bottom surfaces of the bottom electrode and interconnect via being laterally offset from one another provides for a good electrical connection between the interconnect via and the top electrode.

In some embodiments, the present disclosure relates to an integrated chip. The integrated chip includes a lower insulating structure disposed over a lower dielectric structure surrounding an interconnect, the lower insulating structure having sidewalls extending through the lower insulating structure; a bottom electrode arranged along the sidewalls and an upper surface of the lower insulating structure; a data storage structure disposed on first interior sidewalls and an upper surface of the bottom electrode; a top electrode disposed on second interior sidewalls and an upper surface of the data storage structure; and an interconnect via disposed on an upper surface of the top electrode, a bottom surface of the bottom electrode being laterally outside of a bottom surface of the interconnect via. In some embodiments, a boundary of the bottom surface of the bottom electrode is laterally separated from a boundary of the bottom surface of the interconnect via by a non-zero distance as viewed from a top-view of the bottom electrode and as measured along a first direction. In some embodiments, the bottom surface of the bottom electrode has a first width measured along the first direction, wherein the first width is less than the non-zero distance. In some embodiments, the bottom surface of the bottom electrode laterally overlaps a part, but not all, of the bottom surface of the interconnect via. In some embodiments, the upper surface of the top electrode is a substantially flat surface. In some embodiments, the top electrode has third interior sidewalls coupled to opposing sides of a horizontally extending surface to define a recess within the upper surface of the top electrode, the bottom surface of the interconnect via being laterally outside of the recess within the upper surface of the top electrode. In some embodiments, the integrated chip further includes a hard mask disposed over the top electrode, the hard mask having a substantially constant thickness over the upper surface of the top electrode and a variable thickness over the recess within the upper surface of the top electrode, the variable thickness of the hard mask varying over a plurality of different thicknesses. In some embodiments, the integrated chip further includes a hard mask disposed over the top electrode and having one or more curved sidewalls defining a recess within an upper surface of the hard mask, interconnect via being laterally offset from the recess within the upper surface of the hard mask. In some embodiments, a boundary of the bottom surface of the bottom electrode is laterally separated from a boundary of the bottom surface of the interconnect via along a first direction; and the boundary of the bottom surface of the bottom electrode laterally extends past an outermost edge of the boundary of the bottom surface of the interconnect via along a second direction that is perpendicular to the first direction.

In other embodiments, the present disclosure relates to an integrated chip. The integrated chip includes a bottom electrode disposed over a substrate and having a bottom surface in contact with a lower interconnect; a top electrode;

a data storage structure located between the bottom electrode and the top electrode, the data storage structure including a ferroelectric material; and an interconnect via disposed on the top electrode, a projection of a bottom surface of the interconnect via having a first center that is offset from a second center of a projection of the bottom surface of the bottom electrode. In some embodiments, the first center of the projection of the bottom surface of the interconnect via is separated from the second center of the projection of the bottom surface of the bottom electrode by a distance that is in a range of between approximately 1 nanometer (nm) and approximately 1000 nm. In some embodiments, the bottom electrode has one or more first interior sidewalls coupled to a first horizontally extending surface to define a first recess that is within an upper surface of the bottom electrode and that is directly over the bottom surface of the bottom electrode. In some embodiments, the projection of the bottom surface of the interconnect via is separated from the projection of the bottom surface of the bottom electrode by a non-zero distance. In some embodiments, the top electrode has one or more interior sidewalls defining a recess that is within an upper surface of the top electrode and that is laterally offset from an outermost sidewall of the interconnect via. In some embodiments, the integrated chip further includes a dielectric extending from within the recess that is within the upper surface of the top electrode to along opposing sides of the interconnect via. In some embodiments, the integrated chip further includes a hard mask over the top electrode and having a central region having a variable thickness and a peripheral region having a substantially constant thickness, the interconnect via extending through the peripheral region of the hard mask. In some embodiments, the integrated chip further includes a hard mask disposed over the top electrode and having a central region having a thickness that varies over a first range of vertical thicknesses and a peripheral region a thickness that varies over a second range of vertical thicknesses that is smaller than the first range of vertical thicknesses, the interconnect via extending through the peripheral region of the hard mask. In some embodiments, the peripheral region of the hard mask has a substantially constant thickness. In some embodiments, the integrated chip further includes a hard mask disposed over the top electrode and having one or more interior sidewalls that are curved and that meet at a point that is directly over the bottom surface of the bottom electrode, the bottom surface of the interconnect via being laterally separated from the one or more interior sidewalls by a non-zero distance.

In yet other embodiments, the present disclosure relates to a method of forming an integrated chip. The method includes forming a lower insulating structure over an interconnect within a lower dielectric structure over a substrate; removing a part of the lower insulating structure to define an opening extending through the lower insulating structure to the interconnect; sequentially and conformally depositing a bottom electrode layer, a data storage layer, and a top electrode layer over the lower insulating structure; patterning the bottom electrode layer, the data storage layer, and the top electrode layer to define a memory device having a data storage structure disposed between a bottom electrode and a top electrode; and forming an interconnect via onto a substantially flat upper surface of the top electrode, wherein a center of a bottom surface of the bottom electrode is laterally separated from a center of a bottom surface of the interconnect via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated chip, comprising:
   forming a lower insulating structure over an interconnect within a lower dielectric structure over a substrate;
   removing a part of the lower insulating structure to form an opening extending through the lower insulating structure to the interconnect;
   sequentially and conformally depositing a bottom electrode layer, a data storage layer, and a top electrode layer over the lower insulating structure;
   forming a hard mask over the top electrode layer, wherein the hard mask has a thickness that varies over a width of the hard mask;
   patterning the bottom electrode layer, the data storage layer, and the top electrode layer to form a memory device having a data storage structure disposed between a bottom electrode and a top electrode; and
   forming an interconnect via onto a substantially flat upper surface of the top electrode, wherein a center of a bottom surface of the bottom electrode is laterally separated from a center of a bottom surface of the interconnect via, wherein the interconnect via extends through the hard mask and contacts the top electrode laterally outside of a bottommost surface of the top electrode.

2. The method of claim 1,
   wherein the hard mask comprises curved surfaces that form a curved V-shaped region that protrudes to within the top electrode layer; and
   wherein the interconnect via is laterally outside of the curved V-shaped region.

3. The method of claim 1, wherein the thickness varies by a greater amount above a bottommost surface of the bottom electrode layer than laterally outside of the bottommost surface of the bottom electrode layer.

4. The method of claim 1, wherein the top electrode layer has interior surfaces that are vertically below an upper surface of the top electrode layer and that form a recess within the upper surface of the top electrode layer.

5. The method of claim 1, wherein the top electrode is asymmetric about a vertically extending line bisecting the bottom surface of the bottom electrode.

6. A method of forming an integrated chip, comprising:
   depositing a lower insulating structure over an interconnect within a lower interlevel dielectric layer over a substrate;
   etching the lower insulating structure to form an opening exposing the interconnect;
   forming a memory device on the lower insulating structure, wherein the memory device comprises a switching structure disposed between a bottom electrode and a top electrode, a part of the memory device being arranged within the opening;
   forming an interconnect via onto the top electrode, wherein a bottommost surface of the interconnect via is laterally outside of the opening;

forming a hard mask over the top electrode, wherein the hard mask comprises a first region over the opening and a second region laterally outside of the opening, the first region having a thickness that varies over a first range of vertical thicknesses and the second region having a thickness that varies over a second range of vertical thicknesses that is smaller than the first range of vertical thicknesses;

forming a protective layer continuously extending from over the hard mask to along opposing sides of the memory device; and covering the protective layer with an inter-level dielectric layer, wherein the interconnect via extends through the second region of the hard mask, the inter-level dielectric layer, and the protective layer.

7. The method of claim 6, wherein the hard mask comprises curved surfaces that meet at a point over a bottommost surface of the bottom electrode.

8. The method of claim 7, wherein the top electrode has a bottommost surface that continuously extends in opposing directions to non-zero distances past the point.

9. The method of claim 6, wherein a bottommost surface of the bottom electrode and the bottommost surface of the interconnect via are both laterally off-centered from a center of the memory device in a cross-sectional view.

10. The method of claim 6, wherein a bottommost surface of the bottom electrode is arranged laterally between a center of the memory device and a first outermost sidewall of the memory device; and wherein the bottommost surface of the interconnect via is arranged laterally between the center of the memory device and a second outermost sidewall of the memory device that opposes the first outermost sidewall.

11. The method of claim 6, wherein a bottommost surface of the bottom electrode is laterally separated from the bottommost surface of the interconnect via along a first direction; and wherein the bottommost surface of the bottom electrode and the bottommost surface of the interconnect via have opposing outermost edges that are substantially aligned along a second direction that is perpendicular to the first direction in a top-view.

12. The method of claim 6, wherein the bottom electrode comprises an upper surface that laterally extends past opposing outermost sidewalls of the switching structure.

13. The method of claim 6, wherein the protective layer extends to within a divot in an upper surface of the hard mask and the inter-level dielectric layer extends to within a divot in an upper surface of the protective layer.

14. The method of claim 13, further comprising:

depositing a capacitive switching layer on sidewalls and an upper surface of the bottom electrode; and depositing the top electrode on sidewalls and an upper surface of the switching structure.

15. A method of forming an integrated chip, comprising:

depositing a dielectric structure over an interconnect;

etching the dielectric structure to form an opening exposing the interconnect;

depositing a bottom electrode layer on the dielectric structure and within the opening;

depositing a capacitive switching layer on the bottom electrode layer;

depositing a top electrode layer on the capacitive switching layer;

depositing a hard mask over the top electrode layer, the hard mask comprising a first region that is over the opening and that has a variable thickness and a second region that is laterally outside of the opening and that has a substantially constant thickness;

performing a first patterning process on the top electrode layer to form a top electrode;

forming dielectric spacers along opposing sides of the top electrode after performing the first patterning process;

performing a second patterning process on the bottom electrode layer to form a bottom electrode; and forming an interconnect via onto the top electrode, wherein the interconnect via extends through the second region of the hard mask.

16. The method of claim 15, further comprising:

forming a dielectric extending from within a recess that is within an upper surface of the hard mask to along opposing sides of the interconnect via.

17. The method of claim 15, wherein the hard mask comprises a protrusion extending outward from a lower surface of the hard mask to within a recess in the top electrode, the interconnect via being laterally outside of the protrusion.

18. The method of claim 17, wherein the protrusion completely fills the recess in the top electrode.

19. The method of claim 15, wherein the interconnect via contacts the top electrode along a surface of the top electrode that is below a topmost surface of the top electrode.

20. The method of claim 15, wherein a bottom surface of the top electrode is below a top surface of the dielectric structure.

* * * * *